(12) United States Patent
Sato et al.

(10) Patent No.: US 12,523,939 B2
(45) Date of Patent: Jan. 13, 2026

(54) DETERMINATION METHOD, DETERMINATION APPARATUS, INFORMATION PROCESSING METHOD, STORAGE MEDIUM, INFORMATION PROCESSING APPARATUS, LITHOGRAPHIC APPARATUS, AND METHOD FOR MANUFACTURING ARTICLE

(71) Applicant: CANON KABUSHIKI KAISHA, Tokyo (JP)

(72) Inventors: Shuji Sato, Tochigi (JP); Satoshi Sugiura, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 85 days.

(21) Appl. No.: 18/481,030

(22) Filed: Oct. 4, 2023

(65) Prior Publication Data
US 2024/0118626 A1    Apr. 11, 2024

(30) Foreign Application Priority Data
Oct. 6, 2022 (JP) .................. 2022-161856

(51) Int. Cl.
*G03F 7/00* (2006.01)

(52) U.S. Cl.
CPC ........ *G03F 7/70533* (2013.01); *G03F 7/7075* (2013.01); *G03F 7/70775* (2013.01);
(Continued)

(58) Field of Classification Search
CPC ............ G03F 7/70533; G03F 7/70775; G03F 7/70875; G03F 7/70975; G03F 7/7085;
(Continued)

(56) References Cited

U.S. PATENT DOCUMENTS

| 2004/0046545 A1* | 3/2004 | Akiyama | ............ H01L 21/6835 324/757.03 |
| 2008/0232937 A1* | 9/2008 | Abe | .................. H01L 21/67766 414/222.02 |

FOREIGN PATENT DOCUMENTS

| JP | 11145048 A | * 5/1999 | ......... G03F 7/70741 |
| JP | 2008141098 A | 6/2008 | |

(Continued)

OTHER PUBLICATIONS

English translation of JP2017-208450, published Nov. 24, 2017 (Year: 2017).*
English translation of WO 2021/242015, published Dec. 2, 2021. (Year: 2021).*

(Continued)

*Primary Examiner* — Christina A Riddle
(74) *Attorney, Agent, or Firm* — CANON U.S.A., INC. IP DIVISION

(57) ABSTRACT

A determination method includes measuring first relative positions as a first measurement, measuring second relative positions as a second measurement, and determining presence or absence of an abnormality. The first relative positions are relative positions between members corresponding to a plurality of respective measurement positions and a conveyance unit when the conveyance unit moves to the plurality of respective measurement positions. The second relative positions are the relative positions between the members corresponding to the plurality of respective measurement positions and the conveyance unit when the conveyance unit moves to the plurality of respective measurement positions after the first measurement. Presence or absence of an abnormality in the conveyance unit and presence or absence of an abnormality in a floor at one measurement position of the plurality of respective measurement positions is determined based on measurement results of the first and second measurements.

20 Claims, 16 Drawing Sheets

(52) U.S. Cl.
CPC ...... *G03F 7/70875* (2013.01); *G03F 7/70975* (2013.01); *G03F 7/7085* (2013.01)

(58) Field of Classification Search
CPC .............. G03F 7/7075; G03F 7/70525; G03F 9/7003; G03F 7/70483; G03F 7/70491; G03F 7/705; G03F 7/70504; G03F 7/70508; G03F 7/70516; G03F 7/70541; G03F 7/708; G03F 7/70808; G03F 7/70816; G03F 7/70825; G03F 7/70841; G03F 7/70991; G03F 7/70691; G03F 7/70733; G03F 7/70783; G03F 7/70791; G03F 7/70758; H01L 21/68; H01L 21/0274; H01L 21/67276; H01L 21/677; B65G 1/08
USPC .............................. 355/18, 30, 52–55, 67–77
See application file for complete search history.

(56) References Cited

FOREIGN PATENT DOCUMENTS

| JP | 2017208450 | A | * | 11/2017 |
| TW | 202040641 | A | | 11/2020 |
| WO | WO-2021242015 | A1 | * | 12/2021 |

OTHER PUBLICATIONS

English translation of JP11145048, published May 28, 1999 (Year: 1999).*

* cited by examiner

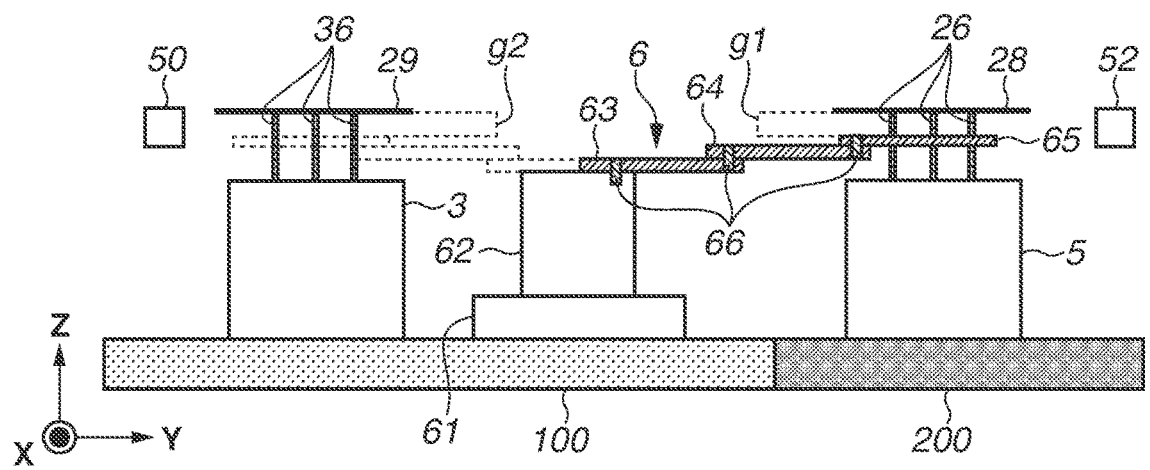
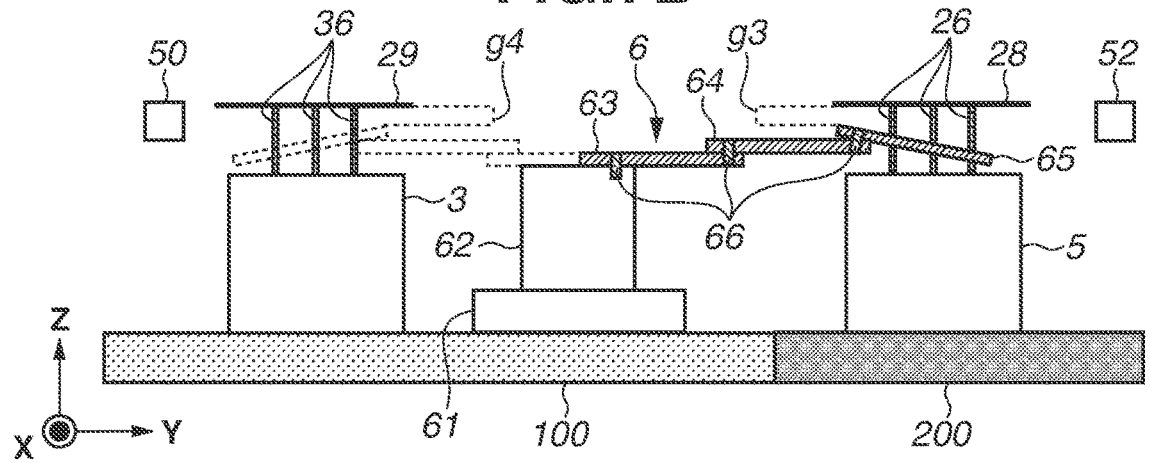
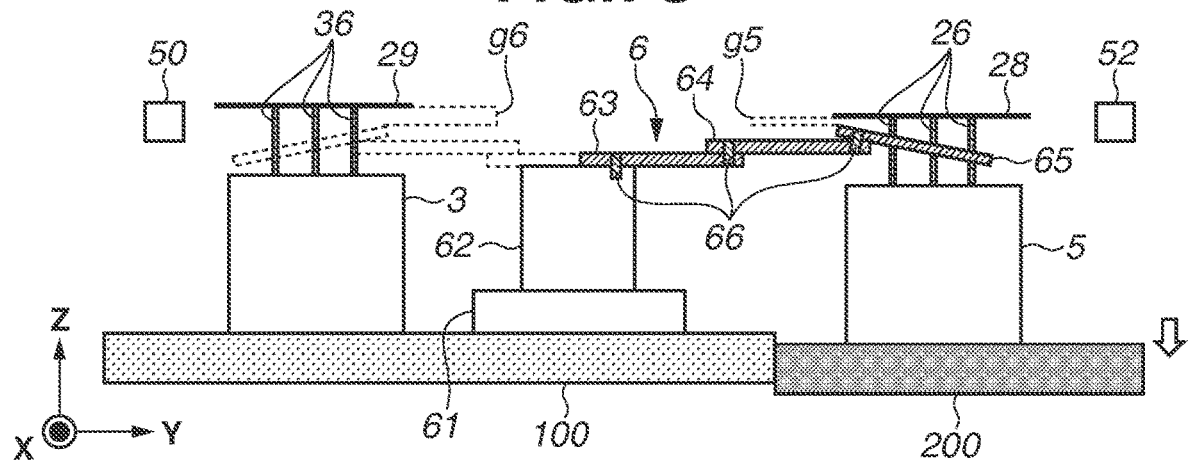

| | | MEASUREMENT RESULT (mm) | | | | | | |
|---|---|---|---|---|---|---|---|---|
| | | FIRST | SECOND | THIRD | FOURTH | FIFTH | | |
| UNIT A | TEMPERATURE ADJUSTMENT UNIT | 1.0 | 1.0 | 1.1 | 1.2 | 1.3 | | |
| UNIT B | PREALIGNMENT UNIT | 1.1 | 1.1 | 1.3 | 1.3 | 1.4 | | |
| UNIT C | SUBSTRATE STAGE | 1.2 | 1.2 | 1.4 | 1.4 | 1.5 | | |
| | δA | 0.0 | 0.1 | 0.1 | 0.1 | | | |
| | δB | 0.0 | 0.2 | 0.0 | 0.1 | | | |
| | δC | 0.0 | 0.2 | 0.0 | 0.1 | | | |
| | ΔAB | 0.0 | 0.1 | 0.1 | 0.0 | | AVERAGE P (AB) | 0.05 (mm) |
| | ΔBC | 0.0 | 0.0 | 0.0 | 0.0 | | AVERAGE P (BC) | 0 (mm) |

| | | MEASUREMENT RESULT (mm) | | | | | | |
|---|---|---|---|---|---|---|---|---|
| | | FIRST | SECOND | THIRD | FOURTH | FIFTH | | |
| UNIT A | TEMPERATURE ADJUSTMENT UNIT | 1.0 | 1.0 | 1.1 | 1.2 | 1.3 | | |
| UNIT B | PREALIGNMENT UNIT | 1.2 | 1.2 | 1.0 | 0.9 | 0.9 | | |
| UNIT C | SUBSTRATE STAGE | 1.1 | 1.1 | 0.9 | 0.8 | 0.8 | | |
| δA | | | 0.0 | 0.1 | 0.1 | 0.1 | | |
| δB | | | 0.0 | -0.2 | -0.1 | 0.0 | | |
| δC | | | 0.0 | -0.2 | -0.1 | 0.0 | | |
| ΔAB | | | 0.0 | 0.3 | 0.2 | 0.1 | AVERAGE P (AB) | 0.15 (mm) |
| ΔBC | | | 0.0 | 0.0 | 0.0 | 0.0 | AVERAGE P (BC) | 0 (mm) |

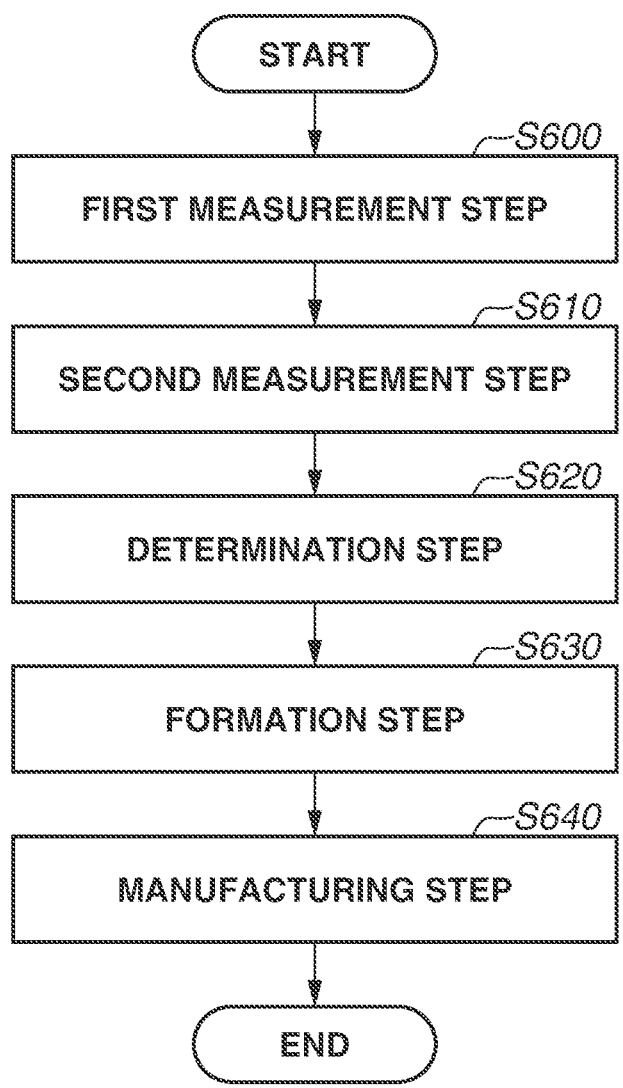

DETERMINATION METHOD, DETERMINATION APPARATUS, INFORMATION PROCESSING METHOD, STORAGE MEDIUM, INFORMATION PROCESSING APPARATUS, LITHOGRAPHIC APPARATUS, AND METHOD FOR MANUFACTURING ARTICLE

BACKGROUND

Field

The present disclosure relates to a determination method, a determination apparatus, an information processing method, a storage medium, an information processing apparatus, a lithographic apparatus, and a method for manufacturing an article.

Description of the Related Art

A substrate processing apparatus including a conveyance unit for conveying substrates is used in manufacturing processes of semiconductor devices or liquid crystal display devices. If there is an abnormality in the relative position between the conveyance unit and a member, such as a substrate, the conveyance unit, and the member, such as a substrate, can interfere with each other.

Japanese Patent Application Laid-Open No. 2008-141098 discusses a method for detecting an abnormality in the position of a conveyance unit by obtaining the coordinates of the conveyance unit at a specific position and comparing the coordinates with reference coordinates.

However, the relative position between the conveyance unit and the member, such as a substrate, can be abnormal due not only to the conveyance unit but also to other factors. For example, an abnormality can occur because of a sunken floor due to the own weight of a unit other than the conveyance unit. To appropriately correct an abnormality in the relative position between the conveyance unit and the member, such as a substrate, the location of cause of the abnormality in the relative position between the conveyance unit and the member, such as a substrate, is desirably identified.

SUMMARY

The present disclosure is directed to providing a determination method advantageous in identifying the cause of a change in a relative position between a conveyance unit and a member such as a substrate.

According to an aspect of the present disclosure, a determination method includes measuring first relative positions as a first measurement, wherein the first relative positions are relative positions between members corresponding to a plurality of respective measurement positions and a conveyance unit when the conveyance unit moves to the plurality of respective measurement positions, measuring second relative positions as a second measurement, wherein the second relative positions are the relative positions between the members corresponding to the plurality of respective measurement positions and the conveyance unit when the conveyance unit moves to the plurality of respective measurement positions after the first measurement, and determining presence or absence of an abnormality in the conveyance unit and presence or absence of an abnormality in a floor at one measurement position of the plurality of respective measurement positions as a determination based on measurement results of the first and second measurements.

Further features of the present disclosure will become apparent from the following description of exemplary embodiments with reference to the attached drawings.

BRIEF DESCRIPTION OF THE DRAWINGS

FIGS. 7A to 7C are schematic diagrams when the conveyance unit acquires a first substrate placed on the substrate stage and a second substrate placed on a temperature adjustment unit.

FIG. 16 is a flowchart of a method for manufacturing an article according to a fourth exemplary embodiment.

DESCRIPTION OF THE EMBODIMENTS

Figure 1:
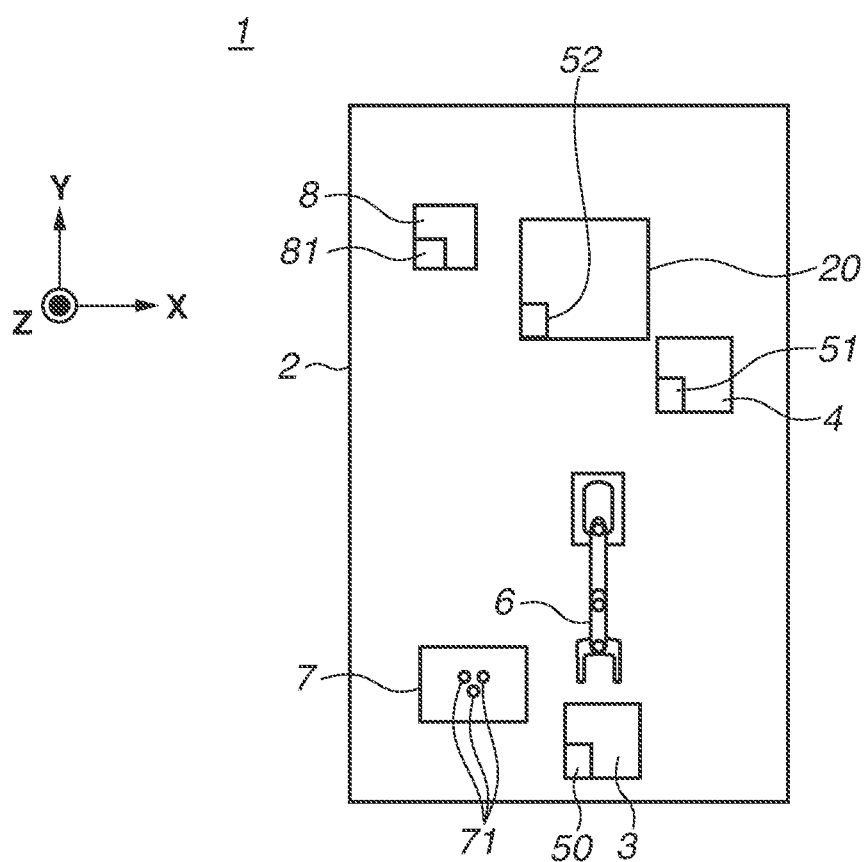
FIG. 1 is a schematic diagram illustrating a configuration of a substrate processing apparatus according to a first exemplary embodiment.

Exemplary embodiments of the present disclosure will be described below with reference to the attached drawings. The following exemplary embodiments are not intended to limit the disclosure set forth in the claims. While the exemplary embodiments describe a plurality of features, all the plurality of features is not necessarily essential to the disclosure, and the features may be combined in any given manner. In the attached drawings, the same or similar components are denoted by the same reference numerals. A redundant description thereof will be omitted.

In this specification and the attached drawings, directions are basically expressed in an XYZ coordinate system with a vertical direction as a Z-axis, a horizontal plane perpendicular to the vertical direction as an XY plane, and the axes orthogonal to each other. However, if an XYZ coordinate system is drawn in a diagram, the drawn XYZ coordinate system is given priority.

Specific configurations of the exemplary embodiments will hereinafter be described.

A first exemplary embodiment will be described. FIG. 1 is a schematic diagram illustrating a configuration of a substrate processing apparatus 1 according to the present exemplary embodiment. In the present exemplary embodiment, the substrate processing apparatus 1 is a projection exposure apparatus for exposing a substrate with a master (mask or reticle) pattern via a projection optical system using a step-and-repeat method or step-and-scan method. However, the substrate processing apparatus 1 is not limited to a projection exposure apparatus. For example, the substrate processing apparatus 1 may be a drawing apparatus that patterns a substrate by drawing a pattern on a substrate using an electron beam or ion beam. The substrate processing apparatus 1 may be another lithographic apparatus, such as an imprint apparatus that forms a pattern on a substrate by molding an imprint material on the substrate. Alternatively, the substrate processing apparatus 1 may be yet another apparatus that process a semiconductor wafer or glass plate substrate, such as an ion injection apparatus, a developing apparatus, an etching apparatus, a film deposition apparatus, an annealing apparatus, a sputtering apparatus, or a vapor deposition apparatus. The substrate processing apparatus 1 may be a planarization apparatus that planarizes a composition on a substrate using a flat plate.

The substrate processing apparatus 1 includes a chamber 2 that covers the entire apparatus, an exposure unit 20 that performs exposure processing, a temperature adjustment unit 3, a prealignment unit 4, a conveyance unit 6 that conveys a substrate to a predetermined position, a stage 7, and a determination unit (determination apparatus) 8. The temperature adjustment unit 3 is configured to adjust the temperature of the substrate placed thereon. The prealignment unit 4 aligns the substrate in advance before the exposure processing by the exposure unit 20. The conveyance unit 6 is a horizontal articulated robot (scalar robot) having a hand, for example. The stage 7 includes support members 71 for supporting a substrate on its top surface, and is configured so that a substrate can be temporarily placed thereon. The determination unit 8 determines an abnormality in the substrate processing apparatus 1. A specific determination method (information processing method) at the determination unit 8 will be described below. Whereas the determination unit 8 determines an abnormality in the substrate processing apparatus 1, the determination unit 8 may also function as a control unit for controlling the substrate processing apparatus 1. The determination unit 8 includes a transmission unit 81 that transmits determined information. The temperature adjustment unit 3 according to the present exemplary embodiment includes a first sensor 50, the prealignment unit 4 a second sensor 51, and the exposure unit 20 a third sensor 52. The first, second, and third sensors 50, 51, and 52 detect relative positions between the conveyance unit 6 and predetermined members at respective positions where the sensors are arranged. Examples of the sensors include camera sensors for detecting a position using a camera, and laser sensors for detecting a position using laser. For example, the first sensor 50 detects a relative position between the conveyance unit 6 and a predetermined member at the temperature adjustment unit 3. An example of the predetermined member is a substrate.

Next, the order of conveyance of a substrate will be described. Initially, a substrate carried into the substrate processing apparatus 1 is placed on the support members 71 protruding from the top surface of the stage 7. The substrate is then conveyed from the stage 7 to the temperature adjustment unit 3 by the conveyance unit 6, and adjusted in temperature by the temperature adjustment unit 3. The substrate adjusted in temperature by the temperature adjustment unit 3 is conveyed to the prealignment unit 4 by the conveyance unit 6, and aligned in advance before the exposure processing. The alignment by the prealignment unit 4 includes adjusting the position of the substrate in the XY plane and the angle of rotation of the substrate, for example. With the alignment completed, the substrate is conveyed to the exposure unit 20 by the conveyance unit 6, and subjected to the exposure processing in the exposure unit 20. While the order of conveyance of the substrate by the conveyance unit 6 according to the present exemplary embodiment has been described, the conveyance destinations and the order of conveyance are not limited to the foregoing example. The user can freely set predetermined positions for the substrate to be conveyed to and the order of conveyance.

Figure 2:
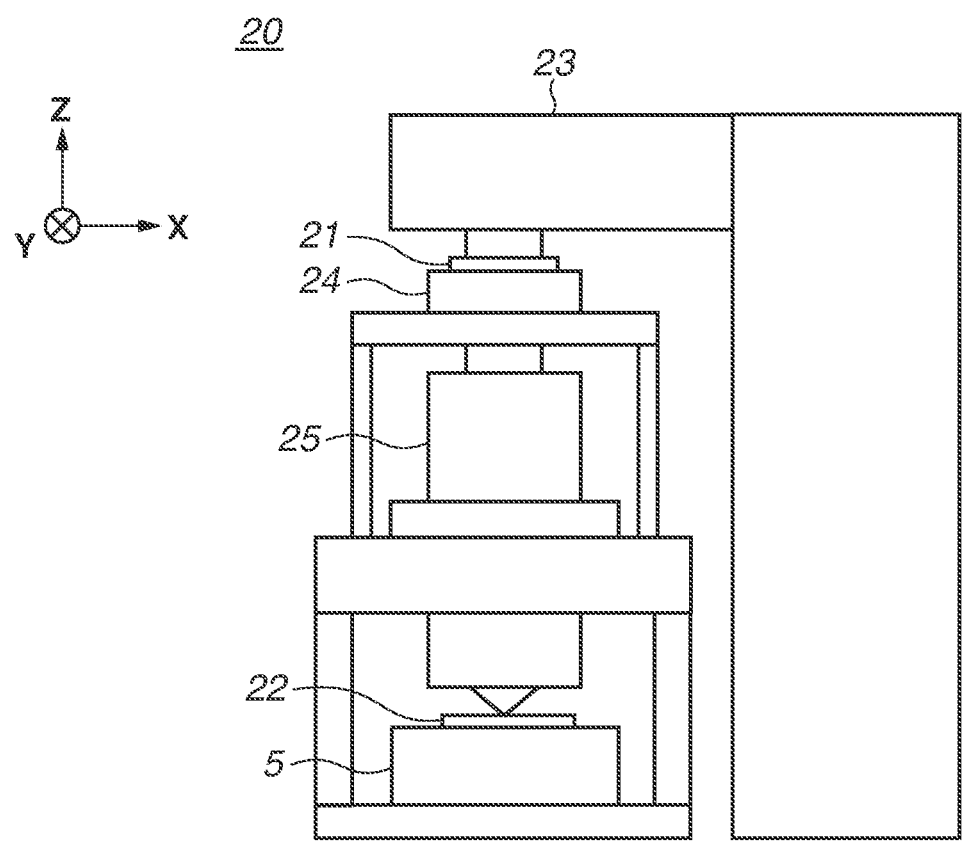
FIG. 2 is a diagram illustrating a configuration of an exposure unit according to the first exemplary embodiment.

FIG. 2 is a diagram illustrating a configuration of the exposure unit 20 according to the present exemplary embodiment. The exposure unit 20 includes an illumination optical system 23 for emitting light, a projection optical system 25, a reticle stage 24 for holding a reticle 21, and a substrate stage 5 for holding a substrate 22. Here, the substrate stage 5 is configured to be movable in the X and Y directions. The substrate 22 conveyed to the exposure unit 20 is placed on the substrate stage 5. The reticle 21 is a master where a pattern (for example, circuit pattern) to be transferred is formed of chromium on the surface of quartz glass, for example. The substrate 22 is made of monocrystalline silicon, for example. If the substrate processing apparatus 1 is an exposure apparatus, the substrate 22 conveyed to the substrate processing apparatus 1 has a photosensitive material (resist) applied on its surface. The illumination optical system 23 is a pattern formation unit for forming a pattern on the substrate 22. While the present disclosure deals with an example of a lithographic apparatus that forms a pattern using light and the pattern formation unit is the illumination optical system 23, a lithographic apparatus that cures a thermosetting material by heat may be used. In such a case, the pattern formation unit is a heating unit for heating the thermosetting material, for example.

In the substrate processing apparatus 1, exposure light from a light source (not illustrated) illuminates the reticle 21 held by the reticle stage 24 via the illumination optical system 23. The substrate 22 is irradiated with the light transmitted through the reticle 21 via the projection optical system 25. Here, an image of the pattern formed on the reticle 21 is formed on the surface of the substrate 22. The substrate processing apparatus 1 thus exposes a shot area on the substrate 22, and similarly exposes a plurality of shot areas one by one.

Figure 3A:
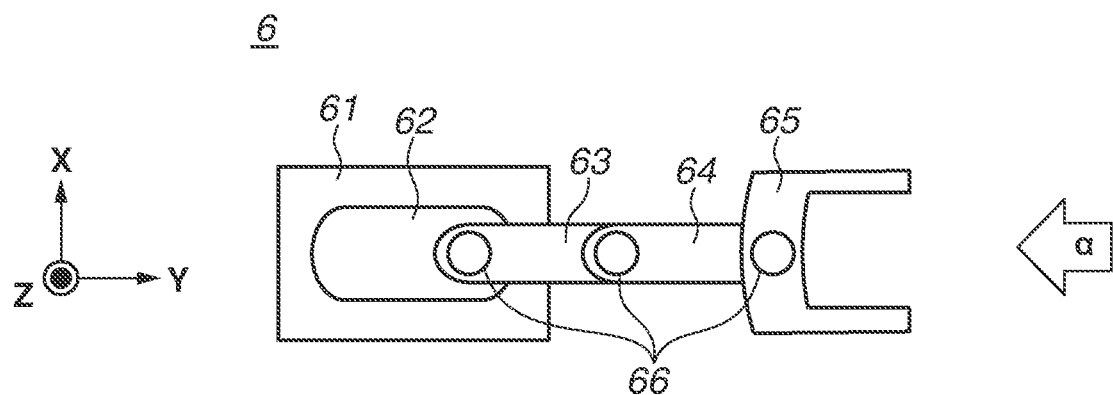
FIGS. 3A and 3B are diagrams illustrating a configuration of a conveyance unit according to the first exemplary embodiment.
Figure 3B:
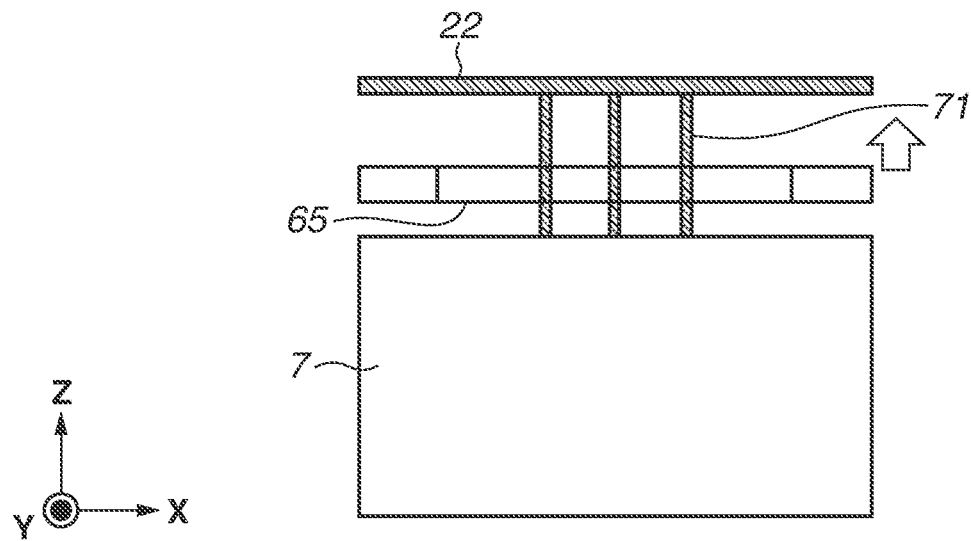

FIGS. 3A and 3B illustrate a configuration of the conveyance unit 6 according to the present exemplary embodiment. FIG. 3A is a view of the conveyance unit 6 seen from a +Z direction-side. The conveyance unit 6 includes a hand 65, and holds and conveys the substrate 22 with the hand 65. The shape of the hand 65 may be other than that illustrated in FIG. 3A and not limited in particular as long as the substrate 22 can be acquired.

To position the hand 65 in four axial directions (X, Y, Z, and OZ), the conveyance unit 6 includes a driving mechanism 61 for driving in a horizontal direction, a driving mechanism 62 for driving in a vertical direction, and a driving mechanism 63 and a driving mechanism 64 for driving in a rotational direction. The driving mechanism 62 for driving in the vertical direction, the driving mechanisms 63 and 64 for driving in the rotational direction, and the hand 65 are coupled with driving shafts 66. The combination of the driving mechanisms is not limited to the foregoing example, and the configurations, types, and number are not limited.

FIG. 3B is a view of the conveyance unit 6 in acquiring the substrate 22 placed on the stage 7, seen in an a direction illustrated in FIG. 3A. The substrate 22 is placed on the support members 71 protruding from the top surface of the stage 7. With the hand 65 inserted under the substrate 22, the hand 65 is moved to approach the substrate 22 by the driving mechanism 62. The hand 65 acquires the substrate 22 from the stage 7 by such a movement.

The conveyance unit 6 continues the conveyance operation while the substrate processing apparatus 1 is in operation.

The driving shafts 66 that are a part of the conveyance unit 6 therefore wear over time with the duration of conveyance and the number of times of conveyance by the conveyance unit 6. Due to this wear over time (secular degradation), the driving shafts 66 change in tilt over time. As the driving shafts 66 wear and tilt, the members coupled by the driving shafts 66 change in position, and the position of the hand 65 to make contact with the substrate 22 is also affected to change. Specifically, a change in the tilts of the driving shafts 66 over time lowers the far side of the hand 65 from the driving shafts 66 in a –Z direction, and the hand 65 sags. As a result, a relative position between the hand 65 and a predetermined member (for example, substrate) changes.

There can be other factors for a change in the position of the hand 65 than the secular change. For example, the position of the hand 65 can change because of abnormal initial attachment positions of the driving shafts 66. If the initial attachment positions of the driving shafts 66 are abnormal, the hand 65 can cause not only a positional abnormality of tilting in the sagging direction (–Z direction) but a positional abnormality of warping upward (+Z direction).

Figure 4A:
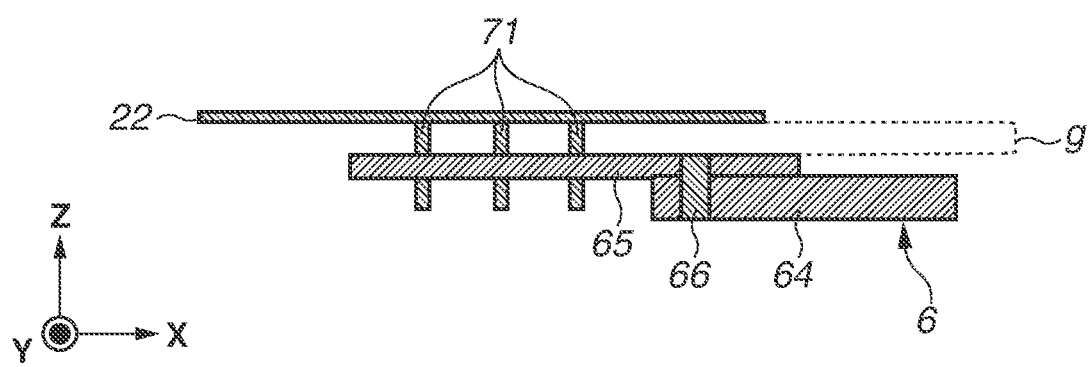
FIGS. 4A and 4B are diagrams illustrating an example where the conveyance unit according to the first exemplary embodiment acquires a substrate from a support member.
Figure 4B:
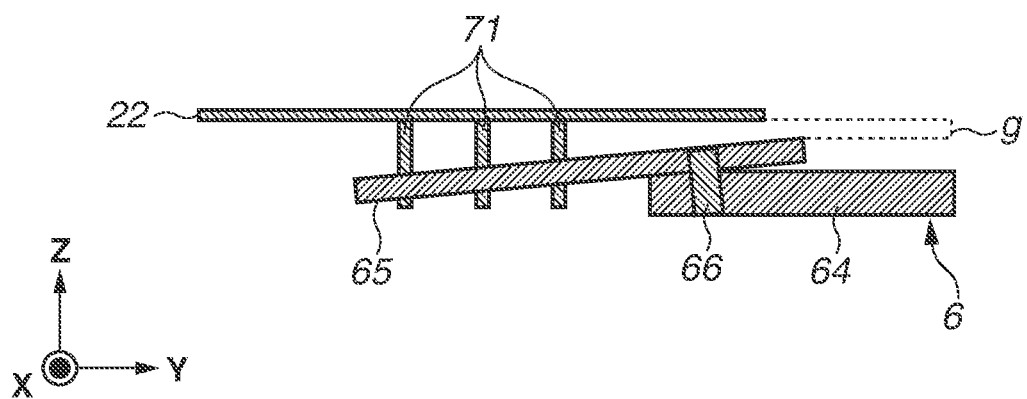

FIGS. 4A and 4B illustrate examples where the conveyance unit 6 according to the present exemplary embodiment acquires the substrate 22 from the support members 71. FIG. 4A illustrates a case where the driving shaft 66 does not tilt. The hand 65 can contact the substrate 22 in a parallel state.

FIG. 4B illustrates a case where the driving shaft 66 tilts. The hand 65 and the substrate 22 contact in a non-parallel, abnormal state. The contact of the hand 65 and the substrate 22 in such an abnormal state (abnormal tilt) can damage the hand 65 and the substrate 22.

A gap g illustrated in FIGS. 4A and 4B is a distance between the substrate holding surface of the hand 65 that is a part of the conveyance unit 6 and the bottom surface of the substrate 22 placed on the support members 71. Even if a moving instruction to the conveyance unit 6 is the same, the gap g varies between when the driving shaft 66 tilts and when not. For example, the gap g in FIG. 4B is smaller than the gap g in FIG. 4A. In other words, a change in the positional state (tilt state) of the hand 65 can be found out by measuring the gap g. The first, second, and third sensors 50, 51, and 52 measure the gap g between the predetermined member (in the present exemplary embodiment, substrate 22) and the conveyance unit 6 (hand 65) at predetermined positions. The gap g indicates the relative position between the predetermined member and the conveyance unit 6.

Figure 5:
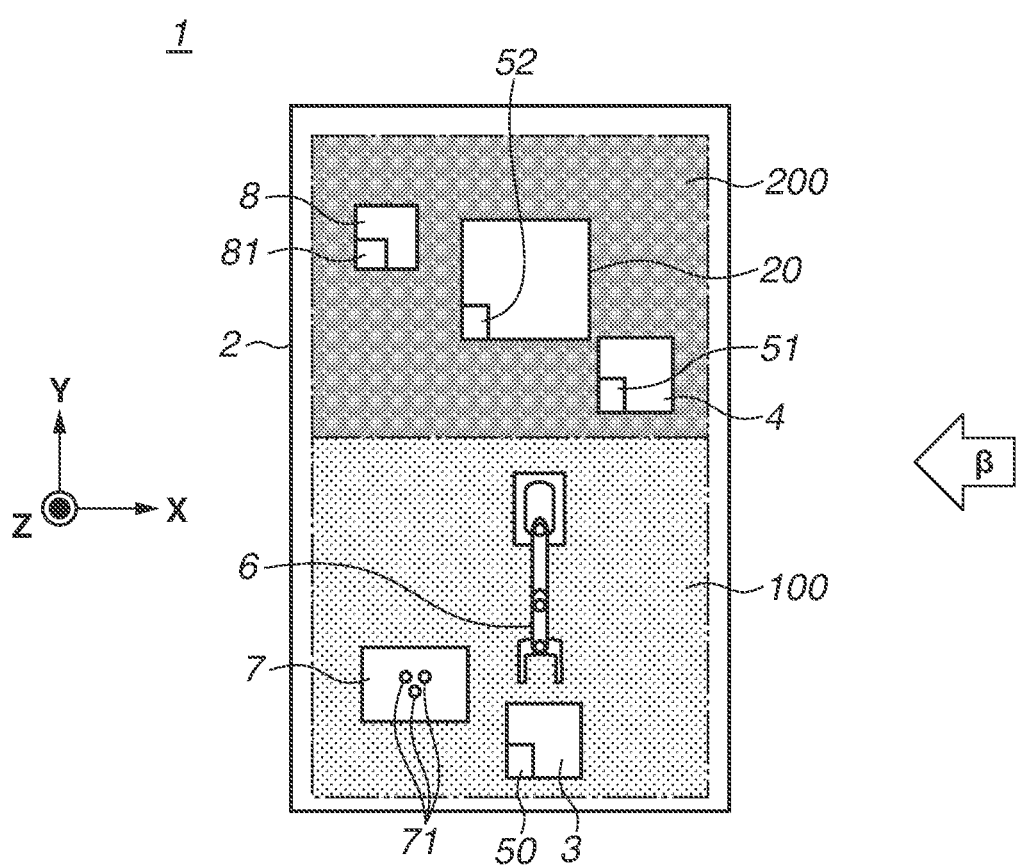
FIG. 5 is a diagram illustrating a floor where units in the substrate processing apparatus according to the first exemplary embodiment are arranged.

FIG. 5 is a diagram illustrating the floor where the units in the substrate processing apparatus 1 according to the present exemplary embodiment are installed. The units refer to the exposure unit 20, the temperature adjustment unit 3, the prealignment unit 4, the determination unit 8, the conveyance unit 6, and the stage 7 constituting the substrate processing apparatus 1 described above.

Each unit is disposed in either one of two modules. The two modules include either a first floor 100 or a second floor 200. For example, the first floor 100 and the second floor 200 according to the present exemplary embodiment are a single member (plate member) each.

The module including the first floor 100 includes the conveyance unit 6, the stage 7, and the temperature adjustment unit 3 installed on the first floor 100. The module including the second floor 200 includes the prealignment unit 4, the exposure unit 20, and the determination unit 8 installed on the second floor 200. In the present exemplary embodiment, the units in the substrate processing apparatus 1 are divided between the two modules so that the prealignment unit 4 and the exposure unit 20 belong to one module, and the temperature adjustment unit 3 and the conveyance unit 6 belong to the other module. However, the number of modules and the internal configurations of the modules are not limited to the example described in the present exemplary embodiment nor are limited in particular.

Figure 6A:
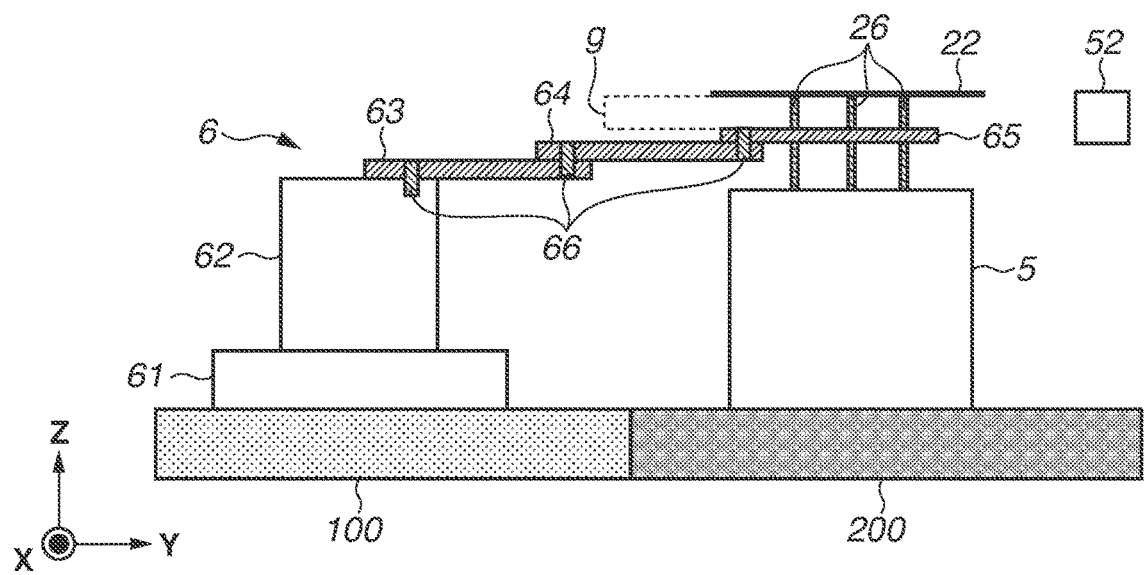
FIGS. 6A and 6B are schematic diagrams when the conveyance unit acquires a substrate placed on a substrate stage.
Figure 6B:
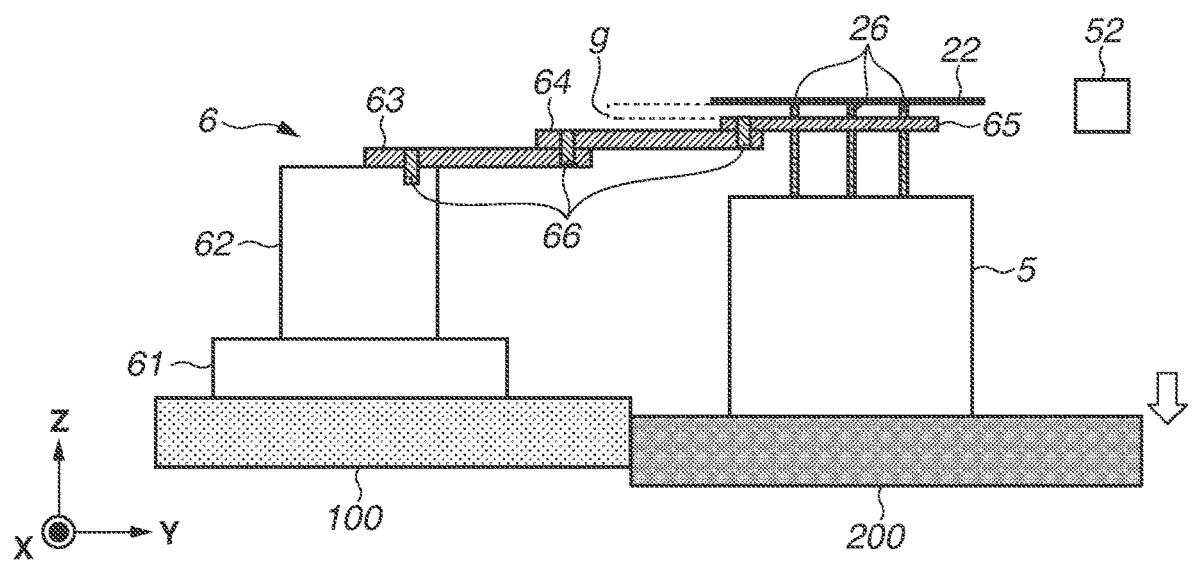

If the interior of the substrate processing apparatus 1 (interior of the chamber 2) is thus divided into modules, the floor of one of the modules in the chamber 2 with heavier units can sink so that the height of the floor of the module is lower than that of the other module. FIGS. 6A and 6B are schematic diagrams when the conveyance unit 6 acquires the substrate 22 placed on the substrate stage 5, seen in a β direction illustrated in FIG. 5. The substrate 22 is supported by support members 26 that are disposed on the substrate stage 5 and movable in the Z-axis direction.

FIG. 6A illustrates a case where the first floor 100 and the second floor 200 are at the same height. FIG. 6B illustrates a case where the exposure unit 20 is heavy and the second floor 200 on which the substrate stage 5 of the exposure unit 20 is disposed sinks and the height of the second floor 200 is lower than that of the first floor 100. The measurement by the third sensor 52 of the gap g indicating the relative position between the hand 65 and the substrate 22 in FIG. 6B is smaller than that in FIG. 6A. The relative position between the conveyance unit 6 and the predetermined member (in the present exemplary embodiment, substrate 22) thus changes due to, in addition to the secular change from the wear of the driving shafts 66, a sunken floor.

FIGS. 7A to 7C are schematic diagrams when the conveyance unit 6 acquires a first substrate 28 (second member) placed on the substrate stage 5 (second measurement position) and a second substrate 29 (first member) placed on the temperature adjustment unit 3 (first measurement position). FIGS. 7A to 7C illustrate situations seen in the β direction illustrated in FIG. 5. The second substrate 29 is supported by support members 36 that are disposed on the temperature adjustment unit 3 and movable along the Z-axis. The conveyance unit 6 in acquiring the second substrate 29 placed on the temperature adjustment unit 3 is illustrated in dotted lines.

FIG. 7A illustrates a case at first timing, where the first floor 100 and the second floor 200 are at the same height. FIG. 7B illustrates a case at second timing when a time has elapsed since the first timing, where the first floor 100 and the second floor 200 are at the same height. FIG. 7C illustrates a case at the second timing when a time has elapsed since the first timing, where the exposure unit 20 is heavy and the second floor 200 on which the substrate stage 5 of the exposure unit 20 is disposed sinks and the height of the second floor 200 is lower than that of the first floor 100.

In the present exemplary embodiment, it is premised that the timing to measure the relative positions between predetermined members at a plurality of measurement positions set by the user in advance and the conveyance unit 6 is when the conveyance unit 6 moves to the plurality of respective measurement positions. Specifically, if the predetermined members are substrates, the relative position is measured each time the substrates placed at the measurement positions (for example, the temperature adjustment unit 3, the prealignment unit 4, and the substrate stage 5) are acquired. To describe the secular change, the first timing and the second timing according to the present exemplary embodiment are premised so that the second timing is when a time has elapsed since the first timing. In the present exemplary embodiment, the measurement of the relative position at the first timing will be referred to as a first measurement process, and the measurement of the relative position at the second timing a second measurement process.

Measurement results obtained by measuring the gap g indicating the relative position between the hand 65 and the first substrate 28 at the substrate stage 5 using the third sensor 52 will be referred to as first gaps (g1, g3, and g5). Measurement results obtained by measuring the gap g indicating the relative position between the hand 65 and the second substrate 29 at the temperature adjustment unit 3 using the first sensor 50 will be referred to as second gaps (g2, g4, and g6).

As illustrated in FIG. 7A, at the first timing where there is no sunken floor and a reference position (reference relative position) of the hand 65 with respect to the substrate at the temperature adjustment unit 3 and that at the substrate stage 5 are the same, the gap g1 and the gap g2 are the same. Here, the reference position may be a position where the hand 65 is positioned under the substrate to start acquisition of the substrate, or where the hand 65 positioned under the substrate has been moved by a predetermined height or for a predetermined time. The first gap g1 and the second gap g2 are first relative positions.

As illustrated in FIG. 7B, at the second timing after a lapse of time since the first timing and where there is no sunken floor, the relative position between the hand 65 and the substrate depends on a secular change (change in the tilt of the hand 65 over time) due to the wear of the driving shafts 66. The gap indicating the relative position between the first substrate 28 on the substrate stage 5 and the conveyance unit 6, measured at the second timing of FIG. 7B is a first gap g3. The gap indicating the relative position between the second substrate 29 on the temperature adjustment unit 3 and the conveyance unit 6, measured at the second timing is a second gap g4. The first gap g3 and the second gap g4 are second relative positions.

A change in the first gap at the substrate stage 5 between the first timing and the second timing (second tendency) is expressed by a difference G3 between the first gap g3 and the first gap g1, or g3−g1. A change in the second gap at the temperature adjustment unit 3 between the first timing and the second timing (first tendency) is expressed by a difference G4 between the second gap g4 and the second gap g2, or g4−g2. In FIG. 7B, there is no sunken floor and the changes in the gaps depend on the secular change in the tilt of the hand 65. In other words, the differences G3 and G4 have similar tendencies. Specifically, the differences G3 and G4 have the same or similar values.

FIG. 7C illustrates a case at the second timing when a time has elapsed since the first timing, where the exposure unit 20 is heavy and the second floor 200 on which the substrate stage 5 of the exposure unit 20 is disposed sinks and the height of the second floor 200 is lower than that of the first floor 100. With such a sunken floor, a change in the relative position between the hand 65 and the substrate depends on a plurality of factors. Specifically, the relative position depends on a change in the position of the unit sunken due to the sunken floor and the secular change (change in the tilt of the hand 65 over time) due to the wear of the driving shafts 66. A gap indicating the relative position of the first substrate 28 on the substrate stage 5 and the conveyance unit 6, measured at the second timing of FIG. 7C is a first gap g5. A gap indicating the relative position between the second substrate 29 on the temperature adjustment unit 3 and the conveyance unit 6, measured at the second timing is a second gap g6. The first gap g5 and the second gap g6 are second relative positions.

A change in the first gap at the substrate stage 5 between the first timing and the second timing (second tendency) is expressed by a difference G5 between the first gap g5 and the first gap g1, or g5−g1. A change in the second gap at the temperature adjustment unit 3 between the first timing and the second timing (first tendency) is expressed by a difference G6 between the second gap g6 and the second gap g2, or g6−g2. Since there is a sunken floor in FIG. 7C, the change in the gap depends on the secular change in the tilt of the hand 65 and a change in the position of the unit sunken due to the sunken floor. In other words, the differences G5 and G6 have different tendencies. Specifically, the difference G5 is greater than the difference G6 in absolute value. The differences G5 and G6 are different in value as much as affected by the sunken floor.

Next, a case where a floor sinks to tilt and the relative position (gap g) between the conveyance unit 6 and a predetermined member (substrate) varies even with units installed on the same floor will be described. Such a tilt of the floor depends on the weights of the units and the installation positions of the units.

Figure 8A:
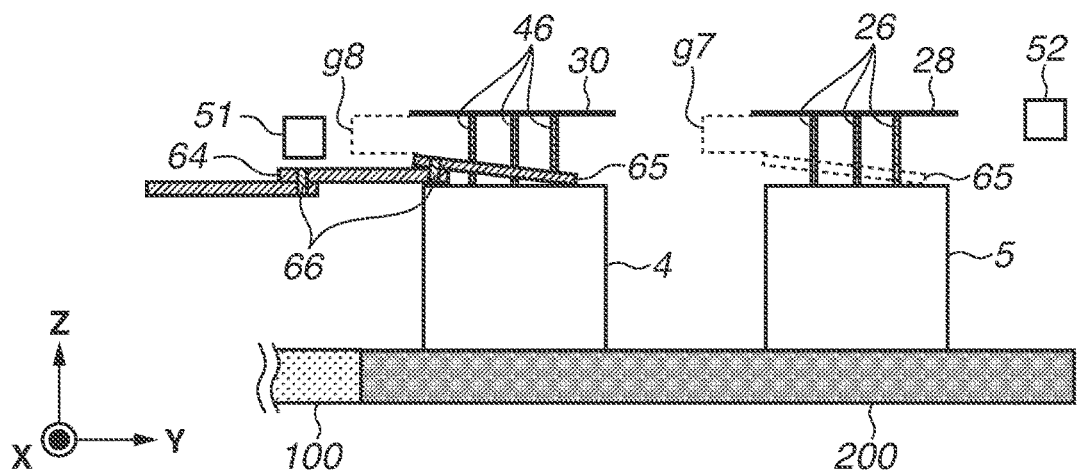
FIGS. 8A to 8C are diagrams illustrating gaps at units on the same floor at first timing or second timing.
Figure 8B:
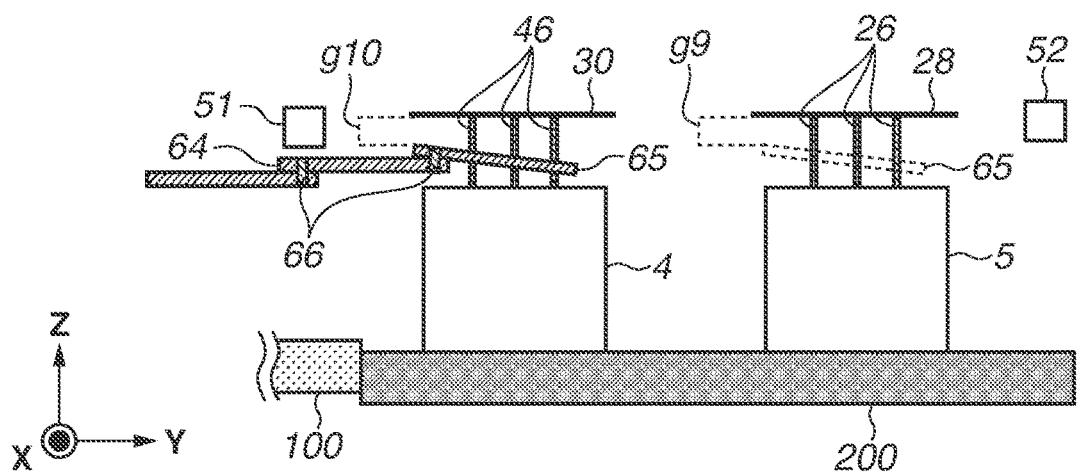
Figure 8C:
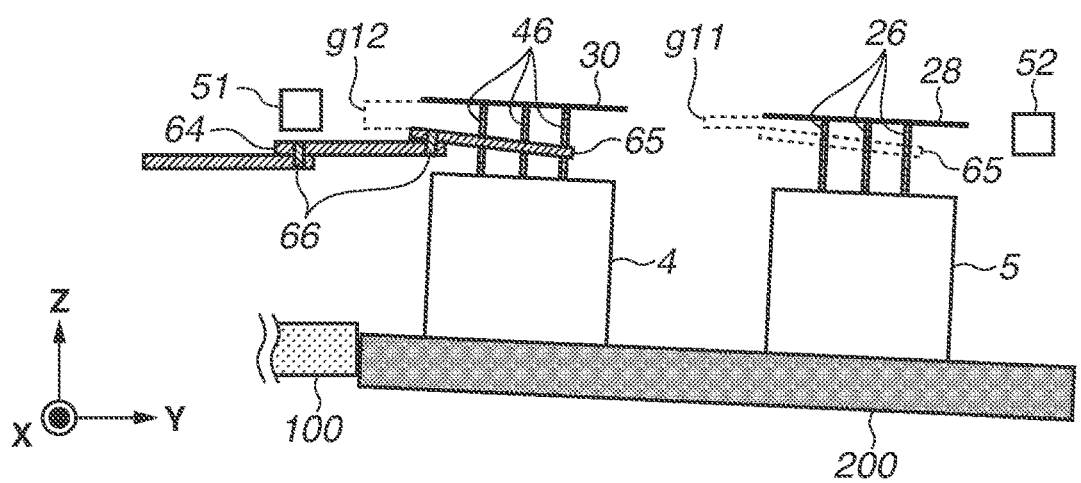

FIGS. 8A to 8C are diagrams illustrating gaps g at units on the same floor at the first timing or the second timing. FIGS. 8A to 8C are schematic diagrams when the conveyance unit 6 acquires the first substrate 28 (second member) placed on the substrate stage 5 (second measurement position) installed on the second floor 200 and a third substrate 30 (first member) placed on the prealignment unit 4 (first measurement position) installed on the second floor 200. FIGS. 8A to 8C illustrate situations seen in the β direction illustrated in FIG. 5. The third substrate 30 is supported by support members 46 that are disposed on the prealignment unit 4 and movable along the Z-axis. The conveyance unit 6 (hand 65) in acquiring the first substrate 28 placed on the substrate stage 5 is illustrated in dotted lines.

Measurement results obtained by measuring the gap g indicating the relative position between the hand 65 and the first substrate 28 at the substrate stage 5 using the third sensor 52 will be referred to as third gaps (g7, g9, and g11).

Measurement results obtained by measuring the gap g indicating the relative position between the hand 65 and the third substrate 30 at the prealignment unit 4 using the second sensor 51 will be referred to as fourth gaps (g8, g10, and g12).

As illustrated in FIG. 8A, at the first timing without a sunken floor and where the reference position (reference relative position) of the hand 65 with respect to the substrate at the prealignment unit 4 is the same as that at the substrate stage 5, the third gap g7 and the fourth gap g8 are the same. Here, the reference position may be a position where the hand 65 is positioned under the substrate to start acquisition of the substrate, or where the hand 65 positioned under the substrate has been moved by a predetermined height or for a predetermined time. The third gap g7 and the fourth gap g8 are first relative positions.

FIG. 8B illustrates a case where the second floor 200 sinks in parallel with the first floor 100. In the case of FIG. 8B, if the reference position (reference relative position) of the hand 65 with respect to the substrate at the prealignment unit 4 is the same as that at the substrate stage 5, the third gap g9 and the fourth gap g10 are the same.

In FIG. 8B, a change in the gap at the substrate stage 5 between the first timing and the second timing (second tendency) is expressed by a difference G9 between the third gap g7 and the third gap g9, or g9−g7. A change in the gap at the prealignment unit 4 between the first timing and the second timing (first tendency) is expressed by a difference G10 between the fourth gap g8 and the fourth gap g10, or g10−g8. In FIG. 8B, since the second floor 200 sinks in parallel with the first floor 100, the differences G9 and G10 have similar tendencies. Specifically, the differences G9 and G10 have the same or similar values. The third gap g9 and the fourth gap g10 are second relative positions.

FIG. 8C illustrates a case where the second floor 200 sinks to tilt with respect to the first floor 100. In the case of FIG. 8C, if the reference position (reference relative position) of the hand 65 with respect to the substrate at the prealignment unit 4 and that at the substrate stage 5 are the same, the third gap g11 is smaller than the fourth gap 12 because the substrate stage 5 that is heavier sinks more.

In FIG. 8C, a change in the gap at the substrate stage 5 between the first timing and the second timing (second tendency) is expressed by a difference G11 between the third gap g7 and the third gap g11, or g11−g7. A change in the gap at the prealignment unit 4 between the first timing and the second timing (first tendency) is expressed by a difference G12 between the fourth gap g8 and the fourth gap g12, or g12−g8. In FIG. 8C, since the second floor 200 sinks to tilt with reference to the first floor 100, the differences G11 and G12 have different tendencies. Specifically, the difference G11 is greater than difference G12 in absolute value. The differences G11 and G12 are different in value as much as a change in height due to the tilt of the floor 200. The third gap g 11 and the fourth gap g12 are second relative positions.

As described above, the relative positions between the conveyance unit 6 and the predetermined members at the respective units arranged at different positions change over time due to the secular change of the conveyance unit 6 and secular changes in the positions and angles of the floors 100 and 200. The secular change of the conveyance unit 6 and the secular changes in the positions and angles of the floors 100 and 200 have different tendencies as to changes in the relative positions at the respective units. In other words, the presence or absence of an abnormality in the conveyance unit 6 and the presence or absence of an abnormality in the floors can be determined from the tendencies of the changes in the relative positions between the conveyance unit 6 and the predetermined members at two or more units. With the causes of a change in the relative positions (abnormalities) thus determined, the user can appropriately handle the abnormalities. For example, if the relative positions between the conveyance unit 6 and the predetermined members change due to the secular change from the tilt of the driving shafts 66 of the conveyance unit 6, the tilt of the driving shafts 66 of the conveyance unit 6 can be corrected. Alternatively, the reference positions for the hand 65 to be inserted to at the respective units can be corrected. On the other hand, if the relative positions between the conveyance unit 6 and the predetermined members change due to a change in the floor, the floor height can be corrected. Alternatively, the reference positions for the hand 65 to be inserted to at the respective units can be corrected based on a change in the relative position affected by the change in the position and angle of the floor.

Figures 9A, 9B:
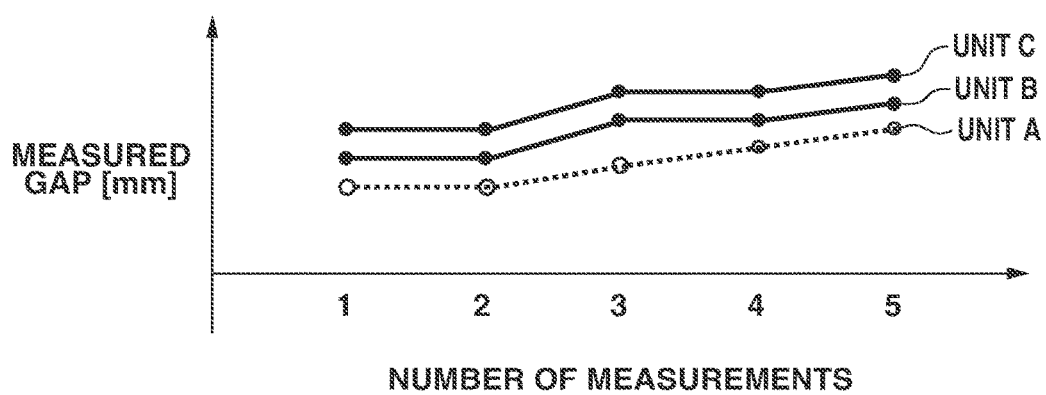
FIGS. 9A and 9B illustrate measurement results of the gaps in a case where there is no abnormality in the floor according to the first exemplary embodiment.

FIGS. 9A and 9B illustrate measurement results of the gaps g according to the present exemplary embodiment in a case where there is no abnormality in the floor. FIGS. 9A and 9B illustrate an example where the gap g between the conveyance unit 6 and a predetermined member was measured five times (at five timings) at each of unit A (temperature adjustment unit 3), unit B (prealignment unit 4), and unit C (substrate stage 5). FIG. 9A is a table illustrating the measurement results. FIG. 9B is a graph illustrating the measurement results. The determination unit 8 determines a difference δ between each measurement result of the predetermined member corresponding to each unit and the previous measurement result from the measurement results of the gap g. The differences δ indicate the tendencies of a change in the relative position between the predetermined member and the conveyance unit 6. More specifically, in the foregoing example, the differences δ indicate the first and second tendencies. For example, a difference δA of the third measurement at unit A is 0.1 (mm), which is the difference between the third measurement result of the gap g, 1.1 (mm), and the second measurement result of the gap g, 1.0 (mm).

The determination unit 8 also determines differences Δ between the differences δ of the predetermined members corresponding to the respective units. The differences Δ indicate a difference in the tendencies of a change in the relative position between the predetermined member and the conveyance unit 6. In other words, the differences Δ indicate a difference between the first tendency and the second tendency. For example, a difference ΔAB between the third measurement results of unit A and unit B is 0.1 (mm) since the difference δA of the third measurement result of unit A is 0.1 (mm) and the difference δB of the third measurement result of unit B is 0.2 (mm). Here, the differences Δ are expressed in absolute values. The determination unit 8 then determines averages P of the differences Δ (differences ΔAB and ΔBC) determined between the units. The average of the differences ΔAB will be referred to as an average P(AB), and the average of the differences ΔBC as an average P(BC). As illustrated in FIGS. 9A and 9B, units A, B, and C have similar tendencies in the secular change. Here, the differences Δ indicate a difference between the first and second tendencies. Being averages of the differences Δ, the averages P also indicate a difference between the first and second tendencies.

While in the present exemplary embodiment the averages are used as values indicating a difference in the tendency of the secular change between the units, the differences between the respective measurement results may be used to make individual determinations instead of the averages.

Coefficients calculated by curve fitting may be used. Other statistical techniques, such as correlation and regression analysis, may be used without any particular limitation.

Figures 10A, 10B:
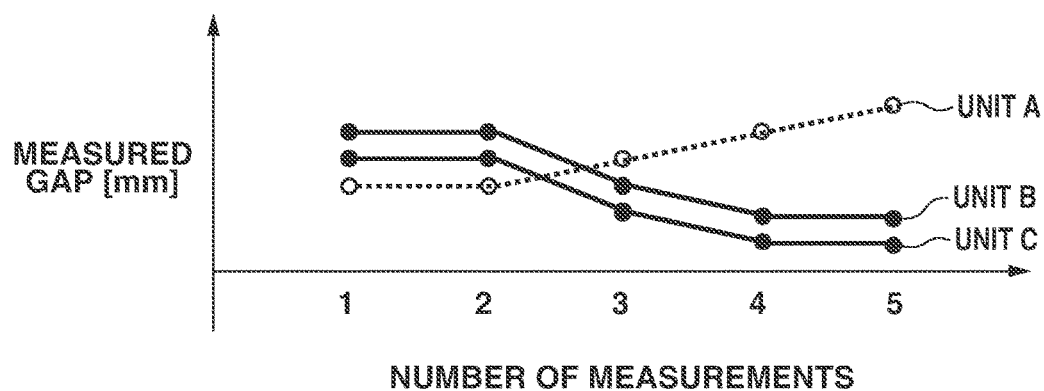
FIGS. 10A and 10B illustrate the measurement results of the gaps in a case where there is an abnormality in the floor according to the present exemplary embodiment.

FIGS. 10A and 10B illustrate measurement results of the gap g according to the present exemplary embodiment in a case where there is an abnormality in the floor. As illustrated in FIGS. 10A and 10B, units A, B, and C have different tendencies of a change in the relative position. Units B and C have similar tendencies in the secular change. From such tendencies, it can be seen that there is an abnormality of a sunken floor where units B and C are installed. The abnormality is also indicated by the averages P. In FIG. 10A, the average P(AB) of units A and B is 0.15 (mm), which is greater than the average P(AB) without the abnormality in FIG. 9A, 0.05 (mm). In other words, the abnormality can be determined by determining the averages P.

The determination unit 8 according to the present exemplary embodiment can determine the presence or absence of an abnormality and the location of the abnormality by determining the averages P. Specifically, the determination unit 8 can make six types of determinations, including no abnormality, an abnormality in the conveyance unit, an abnormality in the floor (sunken floor), both an abnormality in the floor (sunken floor) and an abnormality in the conveyance unit, an abnormality in the floor (sunken floor and floor tilt), and both an abnormality in the floor (sunken floor and floor tilt) and an abnormality in the conveyance unit.

Figure 11:
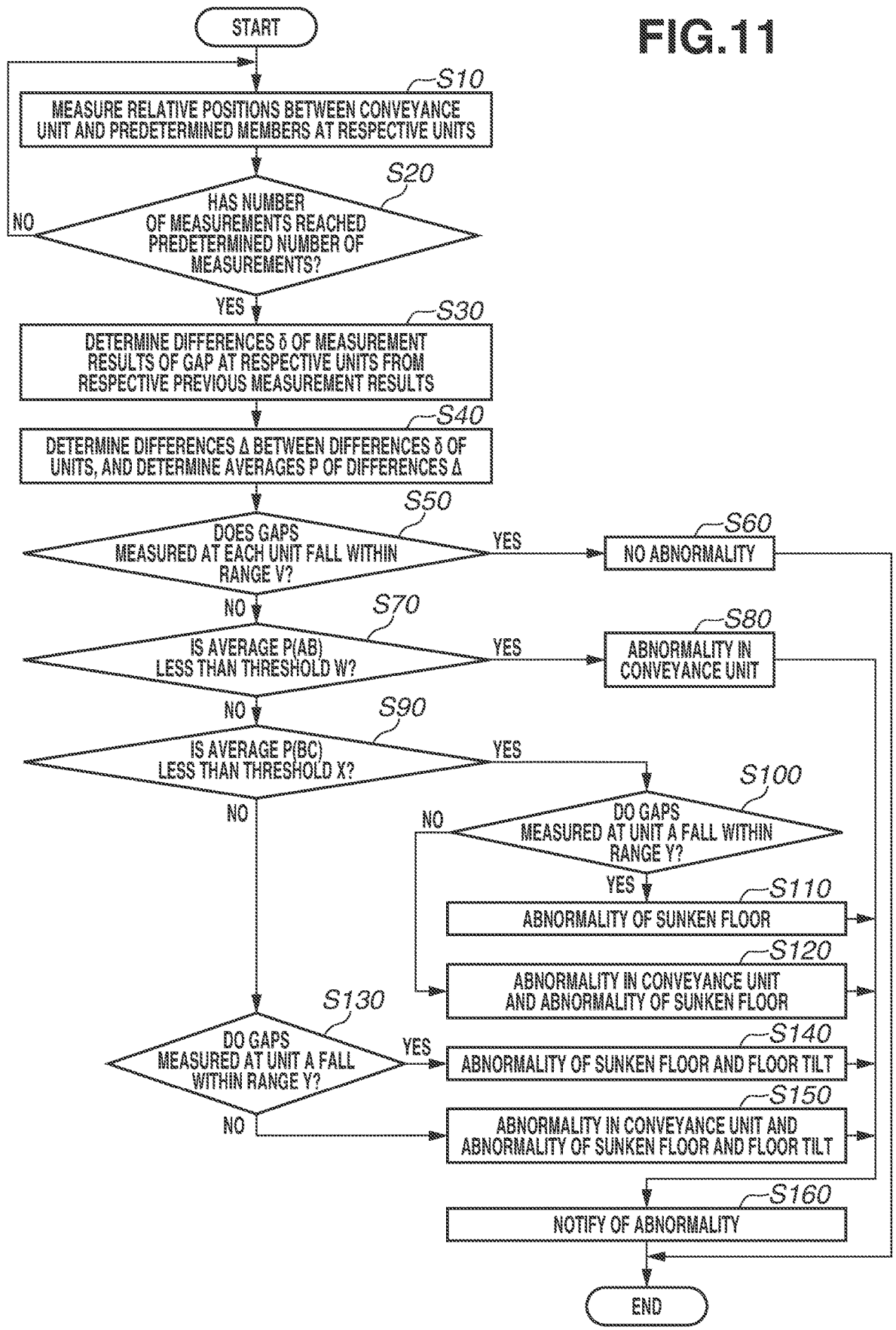
FIG. 11 is an example of a flowchart for determining an abnormality based on a change in the relative position between the conveyance unit and a predetermined member according to the first exemplary embodiment.

FIG. 11 is an example of a flowchart for determining an abnormality based on a change in the relative position between the conveyance unit 6 and a predetermined member according to the present exemplary embodiment. In step S10, the first, second, and third sensors 50, 51, and 52 measure the gap g between the conveyance unit 6 and the predetermined member at the respective units. In step S20, the determination unit 8 determines whether the number of measurements in step S10 has reached a predetermined number of measurements. The predetermined number of measurements here may be freely set by the user. The greater the predetermined number of measurements, the longer the period over which an abnormality is determined from a secular change. In the present exemplary embodiment, the relative position between the predetermined member and the conveyance unit 6 is to be measured each time the conveyance unit 6 moves to each of the measurement positions where the predetermined member is located. However, the relative position between the predetermined member and the conveyance unit 6 does not need to be measured each time the conveyance unit 6 moves to each of the measurement positions, and the timing to measure the relative position may be temporally managed. For example, the user may make a setting in advance to perform step S10 every month. With such a setting, if the predetermined number of measurements is five and the current number of measurements in step S10 is four, step S10 may be skipped until the next timing (one month later). In step S20, if the number of measurements has not reached the predetermined number of measurements (NO in step S20), the processing returns to step S10. If, in step S20, the number of measurements has reached the predetermined number of measurements (YES in step S20), the processing proceeds to step S30. In step S30, the determination unit 8 determines differences δ of the measurement results of the gap g at each unit from the respective previous measurement results. In step S40, the determination unit 8 determines differences Δ between the differences δ of the respective units, and determines averages P of the differences Δ.

In step S50, the determination unit 8 determines whether the gaps g (first and second relative positions) measured at each unit fall within a range V (first range). The determination of step S50 is intended to determine the presence or absence of an abnormality. While in the present exemplary embodiment the determination of step S50 is made based on the first and second relative positions, the determination may be made based on the last measured gap g. The range V is provided for each unit, and set by the user based on the gap g between the conveyance unit 6 and the predetermined member in a case where there is no abnormality in the conveyance unit 6 or the floor. If, in step S50, the gaps g fall within the first range (YES in step S50), the processing proceeds to step S60. In step S60, the determination unit 8 determines that there is no abnormality in the conveyance unit 6 or the floor. The processing ends.

In step S50, if the gap g (at least one of the first and second relative positions) at any of the units is determined to fall outside the first range (NO in step S50), the processing proceeds to step S70. In step S70, the determination unit 8 determines whether the average P(AB) indicating a difference between the first and second tendencies of unit A installed on the same floor as the conveyance unit 6 is and unit B installed on a different floor is less than a threshold W (first threshold). Step S70 is intended to determine the presence or absence of an abnormality of a sunken floor. By determining the average P(AB) of units A and B installed on different floors, the determination unit 8 determines an abnormality from the tendencies of the secular changes of units A and B. The threshold W is set by the user based on the secular changes of the gaps g between the conveyance unit 6 and the predetermined member in a case where there is only an abnormality in the conveyance unit 6 without an abnormality of a sunken floor. If the average P(AB) is greater than or equal to the threshold W (NO in step S70), the processing proceeds to step S90. Here, the determination unit 8 determines that there is at least an abnormality of a sunken floor. If the average P(AB) is less than the threshold W, the determination unit 8 determines that there is no abnormality of a sunken floor. Suppose, for example, that the threshold W is set to 0.1 (mm) in the examples of FIGS. 9A to 10B. In the example of FIGS. 9A and 9B, the determination unit 8 determines that there is no abnormality of a sunken floor. In the example of FIGS. 10A and 10B, the determination unit 8 determines that there is an abnormality of a sunken floor.

In step S70, if the average P(AB) is less than the threshold W (YES in step S70), the processing proceeds to step S80. In step S80, the determination unit 8 determines that there is no abnormality of a sunken floor as mentioned above, since the secular changes of the units installed on the different floors are indicated to have similar tendencies. Since the determination unit 8 determines in step S50 that there is an abnormality and in step S70 that the abnormality is not ascribable to an abnormality of a sunken floor, the determination unit 8 determines here that there is an abnormality in the conveyance unit 6.

In step S90, the determination unit 8 determines whether the average P(BC) indicating a difference between the first and second tendencies of units B and C installed on the floor different from the conveyance unit 6 is less than a threshold X (second threshold). Step S90 is intended to determine whether the floor tilts. The presence or absence of an abnormality of a floor tilt is determined by determining the average P(BC) of units B and C installed on the same floor.

The threshold X is set by the user based on the secular change of the gap g between the conveyance unit 6 and the predetermined member without an abnormality of a floor tilt. If the average P(BC) is greater than or equal to the threshold X, the determination unit 8 determines that there is an abnormality of a floor tilt. If the average P(BC) is less than the threshold X, the determination unit 8 determines that there is no abnormality of a floor tilt.

The presence of an abnormality of a floor tilt also means that there is an abnormality of a sunken floor. While in the present exemplary embodiment whether there is an abnormality of a floor tilt is determined after the determination of the presence of an abnormality of a sunken floor, the order of determination is not limited in particular. That is, whether there is an abnormality of a sunken floor may be determined after the determination of the presence of an abnormality of a floor tilt.

In step S90, if the average P(BC) is less than the threshold X (YES in step S90), the processing proceeds to step S100. The determination unit 8 here determines that there is no abnormality of a floor tilt as mentioned above, since the secular changes of the units installed on the same floor are indicated to have similar tendencies. Since the determination unit 8 determines in step S70 that there is an abnormality in the floor and in step S90 that there is no abnormality of a floor tilt, the determination unit 8 here determines that there is an abnormality of a sunken floor.

In step S100, the determination unit 8 determines whether the gaps g (first and second relative positions) measured at unit A fall within a range Y (second range). Step S100 is intended to determine whether there is an abnormality in the conveyance unit 6 in addition to the abnormality of a sunken floor. While in the present exemplary embodiment the determination of step S100 is made based on the first and second relative positions, the determination may be made based on the last measured gap g. The range Y is set by the user based on the gap g between the conveyance unit 6 and the predetermined member at unit A in a case where there is no abnormality in the conveyance unit 6. In step S100, if both the first and second relative positions fall within the second range (YES in step S100), the processing proceeds to step S110. In step S110, the determination unit 8 determines that there is an abnormality of a sunken floor. If, in step S100, at least one of the first and second relative positions falls outside the second range (NO in step S100), the processing proceeds to step S120. In step S120, the determination unit 8 determines that there are both an abnormality in the conveyance unit 6 and an abnormality of a sunken floor.

In step S90, if the average P(BC) is determined to be greater than or equal to the threshold X (NO in step S90), the processing proceeds to step S130. Since the secular changes of units B and C installed on the same floor have different tendencies, the floor on which units B and C are installed is indicated to tilt. In step S130, the determination unit 8 determines whether the gaps g (first and second relative positions) measured at unit A fall within the range Y (second range). Step S130 is intended to determine whether there is an abnormality in the conveyance unit 6 in addition to an abnormality of a sunken floor and an abnormality of a floor tilt. While in the present exemplary embodiment the determination of step S130 is made based on the first and second relative positions, the determination may be made based on the last measured gap g. In step S130, if both the first and second relative positions fall within the second range (YES in step S130), the processing proceeds to step S140. In step S140, the determination unit 8 determines that there are an abnormality of a sunken floor and an abnormality of a floor tilt. If, in step S130, at least one of the first and second relative positions falls outside the second range (NO in step S130), the processing proceeds to step S150. In step S150, the determination unit 8 determines that there is an abnormality in the conveyance unit 6 concurrently with an abnormality of a sunken floor and an abnormality of a floor tilt. The process of steps S50 to S150 is referred to as a determination process.

In step S160, after the determination in step S80, S110, S120, S140, or S150, the determination unit 8 issues a notification about the determined abnormality or abnormalities. The processing ends. To issue this abnormality notification, the determination unit 8 may control the transmission unit 81 to transmit abnormality-related information to a display control unit (not illustrated). The display control unit may then notify the user of the abnormality or abnormalities by displaying the abnormality-related information on a display unit (not illustrated). Alternatively, the determination unit 8 may control issuance of warning sound and notify the user of the abnormality or abnormalities using the warning sound. The determination unit 8 may be configured to, in the event of an abnormality, notify the user of the abnormality and stop the conveyance by the conveyance unit 6. Stopping the conveyance by the conveyance unit 6 in the event of an abnormality can prevent interference of the conveyance unit 6 with members, such as a substrate.

Figure 12:
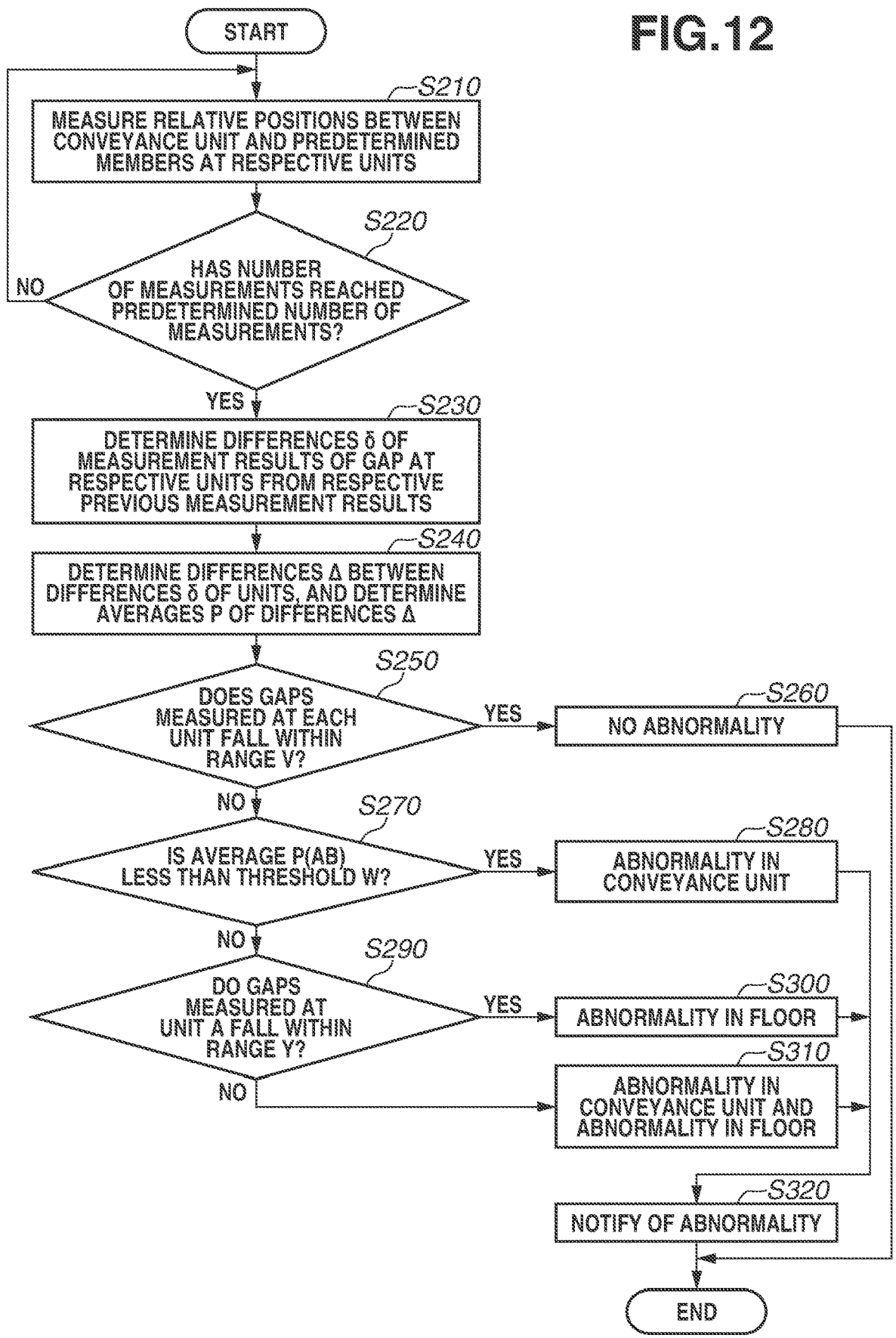
FIG. 12 is another example of the flowchart for determining an abnormality based on a change in the relative position between the conveyance unit and the predetermined member according to the first exemplary embodiment.

FIG. 12 is another example of the flowchart for determining an abnormality based on a change in the relative position between the conveyance unit and a predetermined member according to the present exemplary embodiment, different from that of FIG. 11. FIG. 12 illustrates a case of conducting measurement at two measurement positions that are unit A installed on the same floor as the conveyance unit 6 is and unit B installed on a different floor, and determining an abnormality.

In step S210, the first, second, and third sensors 50, 51, and 52 initially measure the gap g between a predetermined member at the respective units and the conveyance unit 6. In step S220, the determination unit 8 determines whether the number of measurements in step S210 has reached a predetermined number of measurements. If, in step S220, the number of measurements has not reached the predetermined number of measurements (NO in step S220), the processing returns to step S210. If, in step S220, the number of measurements has reached the predetermined number of measurements (YES in step S220), the processing proceeds to step S230. In step S230, the determination unit 8 determines differences δ of the measurement results of the gap g at each unit from the respective previous measurement results. In step S240, the determination unit 8 determines differences Δ between the differences δ of the respective units, and determines averages P of the differences Δ.

In step S250, the determination unit 8 determines whether the gaps g (first and second relative positions) measured at each unit fall within the range V (first range). The determination of step S250 is intended to determine the presence or absence of an abnormality. While in the present exemplary embodiment the determination of step S250 is made based on the first and second relative positions, the determination may be made based on the last measured gap g. The range V is provided for each unit, and set by the user based on the gap g between the conveyance unit 6 and the predetermined member in a case where there is no abnormality in the conveyance unit 6 or the floor. If, in step S250, the gaps g fall within the first range (YES in step S250), the processing proceeds to step S260. In step S260, the determination unit 8 determines that there is no abnormality in the conveyance unit 6 or the floor. The processing ends.

In step S250, if the gap g (at least one of the first and second relative positions) at any of the units is determined to fall outside the first range (NO in step S250), the processing proceeds to step S270.

In step S270, the determination unit 8 determines whether the average P(AB) indicating a difference between the first and second tendencies of unit A installed on the same floor as the conveyance unit 6 is and unit B installed on a different floor is less than the threshold W (first threshold). Step S270 is intended to determine the presence or absence of an abnormality of a sunken floor. By determining the average P(AB) of units A and B installed on different floors, the determination unit 8 determines an abnormality from the tendencies of the secular changes of units A and B. The threshold W is set by the user based on the secular changes of the gaps g between the conveyance unit 6 and the predetermined member in a case where there is only an abnormality in the conveyance unit 6 without an abnormality of a sunken floor. If the average P(AB) is greater than or equal to the threshold W (NO in step S270), the processing proceeds to step S290. Here, the determination unit 8 determines that there is at least an abnormality of a sunken floor. If the average P(AB) is less than the threshold W, the determination unit 8 determines that there is no abnormality of a sunken floor.

In step S270, if the average P(AB) is less than the threshold W (YES in step S270), the processing proceeds to step S280. In step S280, the determination unit 8 determines that there is no abnormality of a sunken floor as mentioned above, since the secular changes of the units installed on the different floors are indicated to have similar tendencies. Since the determination unit 8 determines in step S250 that there is an abnormality and in step S270 that the abnormality is not ascribable to an abnormality of a sunken floor, the determination unit 8 determines here that there is an abnormality in the conveyance unit 6.

In step S290, the determination unit 8 determines whether the gaps g (first and second relative positions) measured at unit A fall within the range Y (second range). Step S290 is intended to determine where there is an abnormality in the conveyance unit 6 in addition to an abnormality of a sunken floor. While in the present exemplary embodiment the determination of step S290 is made based on the first and second relative positions, the determination may be made based on the last measured gap g. If, in step S290, both the first and second relative positions fall within the second range (YES in step S290), the processing proceeds to step S300. In step S300, the determination unit 8 determines that there is an abnormality of a sunken floor. If, in step S290, at least one of the first and second relative positions falls outside the second range (NO in step S290), the processing proceeds to step S310. In step S310, the determination unit 8 determines that there is an abnormality in the conveyance unit 6 and an abnormality of a sunken floor. The process of steps S250 to S310 is referred to as a determination process.

In step S320, after the determination in step S280, S300, or S310, the determination unit 8 issues a notification about the determined abnormality or abnormalities. The processing ends.

Figure 13:
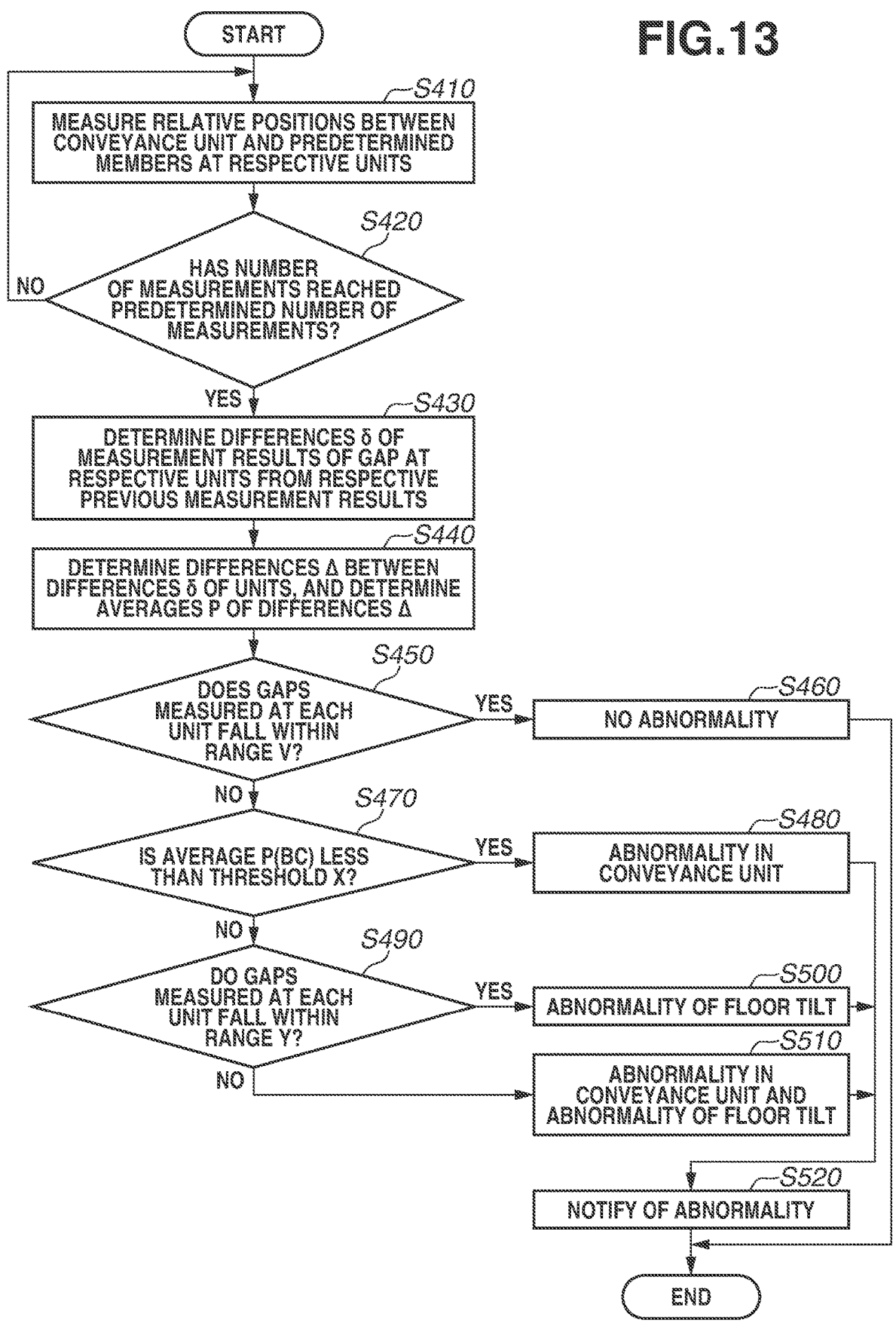
FIG. 13 is yet another example of the flowchart for determining an abnormality based on a change in the relative position between the conveyance unit and the predetermined member according to the first exemplary embodiment.

FIG. 13 is another example of the flowchart for determining an abnormality based on a change in the relative position between the conveyance unit and a predetermined member according to the present exemplary embodiment, different from those of FIGS. 11 and 12. FIG. 13 illustrates a case of conducting measurement at two measurement positions that are units B and C installed on a floor different from the conveyance unit 6, and determining an abnormality. Units B and C are installed on the same floor.

In step S410, the first, second, and third sensors 50, 51, and 52 initially measure the gap g between a predetermined member at the respective units and the conveyance unit 6. In step S420, the determination unit 8 determines whether the number of measurements in step S410 has reached a predetermined number of measurements. If, in step S420, the number of measurements has not reached the predetermined number of measurements (NO in step S420), the processing returns to step S410. If, in step S420, the number of measurements has reached the predetermined number of measurements (YES in step S420), the processing proceeds to step S430. In step S430, the determination unit 8 determines differences δ of the measurement results of the gap g at each unit from the respective previous measurement results. In step S440, the determination unit 8 determines differences Δ between the differences δ of the respective units, and determines averages P of the differences Δ.

In step S450, the determination unit 8 determines whether the gaps g (first and second relative positions) measured at each unit fall within the range V (first range). The determination of step S450 is intended to determine the presence or absence of an abnormality. While in the present exemplary embodiment the determination of step S450 is made based on the first and second relative positions, the determination may be made based on the last measured gap g. The range V is provided for each unit, and set by the user based on the gap g between the conveyance unit 6 and the predetermined member in a case where there is no abnormality in the conveyance unit 6 or the floor. If, in step S450, the gaps g fall within the first range (YES in step S450), the processing proceeds to step S460. In step S460, the determination unit 8 determines that there is no abnormality in the conveyance unit 6 or the floor. The processing ends.

In step S450, if the gap g (at least one of the first and second relative positions) at any of the units is determined to fall outside the first range (NO in step S450), the processing proceeds to step S470.

In step S470, the determination unit 8 determines whether the average P(BC) indicating a difference between the first and second tendencies of units B and C installed on the floor different from the conveyance unit 6 is less than the threshold X (second threshold). Step S470 is intended to determine whether the floor tilts. The presence or absence of an abnormality due to a floor tilt is determined by determining the average P(BC) of units B and C installed on the same floor. The threshold X is set by the user based on the secular change of the gap g between the conveyance unit 6 and the predetermined member in a case where there is only an abnormality in the conveyance unit 6 without an abnormality of a floor tilt. If the average P(BC) is greater than or equal to the threshold X, the determination unit 8 determines that there is an abnormality of a floor tilt. If the average P(BC) is less than the threshold X, the determination unit 8 determines that there is no abnormality of a floor tilt. The presence of an abnormality of a floor tilt also means that there is an abnormality of a sunken floor.

In step S470, if the average P(BC) is less than the threshold X (YES in step S470), the processing proceeds to step S480. In step S480, the determination unit 8 determines that there is no abnormality of a floor tilt as mentioned above, since the secular changes of the units installed on the same floor are indicated to have similar tendencies. Since the determination unit 8 determines in step S450 that there is an abnormality in the floor and in step S470 that there is no abnormality of a floor tilt, the determination unit 8 here determines that there is an abnormality in the conveyance unit 6.

If, in step S470, the average P(BC) is determined to be greater than or equal to the threshold X (NO in step S470), the processing proceeds to step S490. This means that the secular changes in the gaps g at units B and C installed on the same floor have different tendencies, and the floor where units B and C are installed tilts. In step S490, the determination unit 8 determines whether the gap g (first and second relative positions) measured at each unit fall within the range Y (second range). Step S490 is intended to determine whether there is an abnormality in the conveyance unit 6 in addition to an abnormality of a sunken floor. While in the present exemplary embodiment the determination of step S490 is made based on the first and second relative positions, the determination may be made based on the last measured gaps g. If, in step S490, both the first and second relative positions fall within the second range (YES in step S490), the processing proceeds to step S500. In step S500, the determination unit 8 determines that there is an abnormality of a sunken floor. If, in step S490, at least one of the first and second relative positions falls outside the second range (NO in step S490), the processing proceeds to step S510. In step S510, the determination unit 8 determines that there are both an abnormality in the conveyance unit 6 and an abnormality of a sunken floor. The process of steps S450 to S510 is referred to as a determination process.

In step S520, after the determination in step S480, S500, or S510, the determination unit 8 issues a notification about the determined abnormality or abnormalities. The processing ends.

While in the present exemplary embodiment the determination unit 8 is disposed inside the substrate processing apparatus 1, the determination unit 8 may be a processing unit of an information processing apparatus that is disposed outside the substrate processing apparatus 1 and communicates information with the substrate processing apparatus 1. In such a case, the determination unit (processing unit) 8 determines an abnormality based on information about the gas G measured in the substrate processing apparatus 1, and notifies the substrate processing apparatus 1 of the determination result. With such a configuration, the load of the determination processing can be processed outside the substrate processing apparatus 1.

Specifically, the information processing apparatus includes an obtaining unit that obtains relative positions between the members corresponding to a plurality of respective measurement positions and the conveyance unit 6, and the processing unit that determines an abnormality based on information obtained by the obtaining unit. The obtaining unit obtains the measurement results of first relative positions that are the relative positions between the members corresponding to the plurality of respective measurement positions and the conveyance unit 6 when the conveyance unit 6 moves to the plurality of respective measurement positions. The obtaining unit further obtains the measurement results of second relative positions that are the relative positions between the members corresponding to the plurality of measurement positions and the conveyance unit 6 when the conveyance unit 6 moves to the plurality of respective measurement positions after the measurement of the first relative positions. The process where the obtaining unit obtains the measurement results of the first relative positions and the measurement results of the second relative positions is referred to as an obtaining process. The processing unit determines the presence or absence of an abnormality in the conveyance unit 6 and the presence or absence of an abnormality in the floor at one of the measurement positions based on the measurement results of the first and second relative positions obtained by the obtaining unit (determination process).

The determination unit (processing unit) 8 can be constituted, for example, by a programmable logic device (PLD), such as a field-programmable gate array (FPGA), an application-specific integrated circuit (ASIC), a computer with a built-in program, or a combination of all or some of those. The determination unit (processing unit) 8 includes a central processing unit (CPU), a bus, a read-only memory (ROM), a random access memory (RAM), and a storage device. Each component functions based on a program. The CPU is a processing unit that performs calculations for control based on a program and controls the components connected with the bus. The ROM is a memory dedicated to data read, and stores programs and data. The RAM is a memory intended for data read and write, and is used to store programs and data and temporarily store data, such as the results of calculation by the CPU. The storage device is also used to store programs and data. The storage device is used also as a temporary storage area of an operating system (OS) program of the determination unit (processing unit) 8 and data. The storage device is slower than the RAM in terms of data input and output, but can store a large amount of data. The storage device is desirably a nonvolatile storage device that can store data as persistent data so that the stored data can be referred to for a long period of time. The storage device is mainly constituted by a magnetic storage device (hard disk drive [HDD]), but may be an apparatus into which an external medium, such as a compact disc (CD), a digital versatile disc (DVD), and a memory card, is loaded for data read and write.

The determination unit (processing unit) 8 determines an abnormality based on a program stored inside.

According to the present exemplary embodiment, relative positions between the conveyance unit 6 and the predetermined members (for example, substrates) on the units located at the plurality of measurement positions (different positions) can be determined and a location of abnormality can be identified based on the gaps g between the conveyance unit 6 and the predetermined members.

Specifically, the presence or absence of an abnormality in the conveyance unit 6 and the presence or absence of an abnormality in the floor at one of the measurement positions can be determined based on the measurement results of the first measurement process and the second measurement process. More specifically, if the substrate processing apparatus 1 is a lithographic apparatus, the location of an abnormality occurring inside the lithographic apparatus can be identified.

Figure 14:
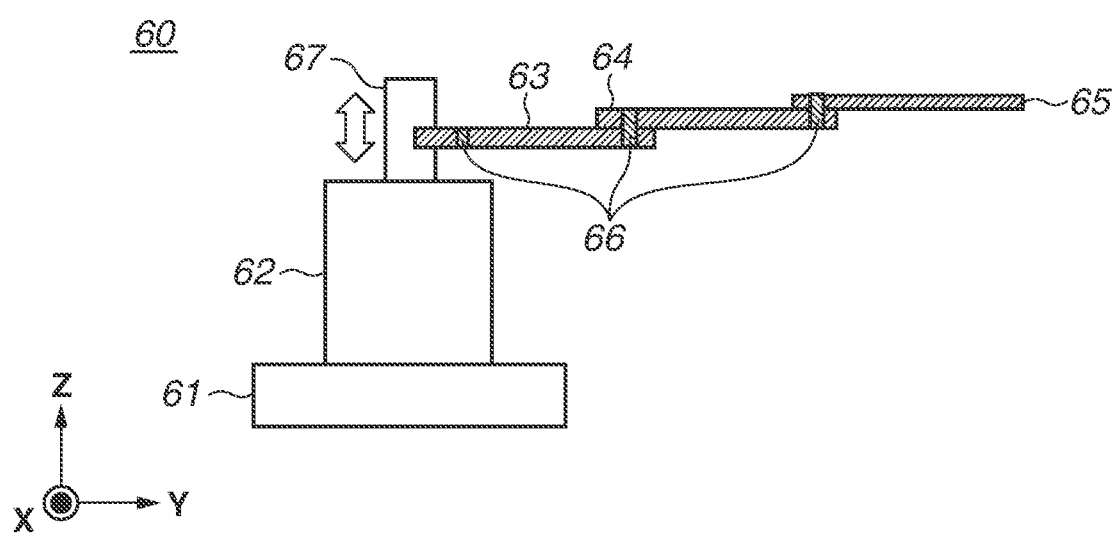
FIG. 14 is a diagram illustrating a configuration of a conveyance unit according to a second exemplary embodiment.

A second exemplary embodiment will be described. A determination unit 8 according to the present exemplary embodiment is characterized in performing control (determination) for adjusting a reference position of a hand 65 of a conveyance unit 6 in addition to the characteristics of the first exemplary embodiment. FIG. 14 is a diagram illustrating a configuration of a conveyance unit 60 according to the present exemplary embodiment. The conveyance unit 60 includes a driving mechanism 67 vertically movable along a Z-axis. A driving mechanism 63 is attached to the driving mechanism 67.

The vertical movement of the driving mechanism 67 vertically moves the driving mechanism 63, a driving mechanism 64, and the hand 65 as well.

The determination unit 8 according to the present exemplary embodiment controls adjustment of the reference position in inserting the hand 65 into each unit based on a location of abnormality and a gap g at each unit. Suppose, for example, that there is an abnormality of a sunken floor as illustrated in FIG. 6B. In such a case, the reference position in inserting the hand 65 at a substrate stage 5 is adjusted in a −Z direction since the gap g between the hand 65 and a substrate 22 is small. Such an adjustment reduces the possibility of interference of the hand 65 with a member, such as the substrate 22, when the hand 65 is inserted under the substrate 22 on the substrate stage 5. Specifically, if the gap g decreases by 0.2 (mm) due to a sunken floor, the reference position of the conveyance unit 6 (hand 65) is adjusted by −0.2 (mm) with respect to the units installed on the sunken floor.

If, for example, there is an abnormality in the conveyance unit 6 due to sagging of the hand 65 as illustrated in FIG. 7B, the gap g between the hand 65 and the substrate 22 becomes smaller than a desired value at all the units. In such a case, the determination unit 8 controls the adjustment of the reference positions in inserting the hand 65 at all the units in the −Z direction. The amount of adjustment of the reference positions in the −Z direction is determined based on the gaps g (relative positions) between the conveyance unit 6 and the predetermined members.

The user may freely adjust the reference positions. For example, the user may modify the reference position at a location not determined to have an abnormality in consideration of other conditions. For example, the user can adjust the reference position only at a predetermined unit in view of slight variations in height that are not detectable from the measurements of the gap g.

The reference position of the conveyance unit 6 does not necessarily need to be adjusted for the measured units alone. For example, suppose that the gaps g between the conveyance unit 6 and the predetermined members at the temperature adjustment unit 3, the prealignment unit 4, and the substrate stage 5 are measured, and there is determined to be an abnormality in a floor 200. In such a case, the determination unit 8 may also adjust the position of the conveyance unit 6 with respect to a not-measured unit on the second floor 200 in consideration of the effect of the abnormality in the floor on this unit. Such an adjustment to the reference position may be made regardless of the type of abnormality, or the reference position with respect to a not-measured unit may be adjusted in the event of an abnormality in the conveyance unit 6, for example. Alternatively, the reference positions with respect to the units installed on the target floor may be adjusted in the event of an abnormality in the floor, and the reference positions with respect to the measured units may further be adjusted as much as the measured displacements in addition to the foregoing adjustment to the reference positions.

As described above, the determination unit 8 according to the present exemplary embodiment adjusts the position of the hand 65 based on the location of abnormality and the gaps g at the respective units. The positional adjustment is made to some or all of the units depending on the location of abnormality.

According to the present exemplary embodiment, the reference positions of the conveyance unit 6 can be adjusted depending on the location of abnormality, and the possibility of interference of the conveyance unit 6 with predetermined members, such as substrates, can be reduced. Moreover, the possibility of interference of the conveyance unit 6 with predetermined members, such as substrates, can be reduced across the entire apparatus by applying the adjustment to units of which the reference positions are not measured as well.

Figure 15A:
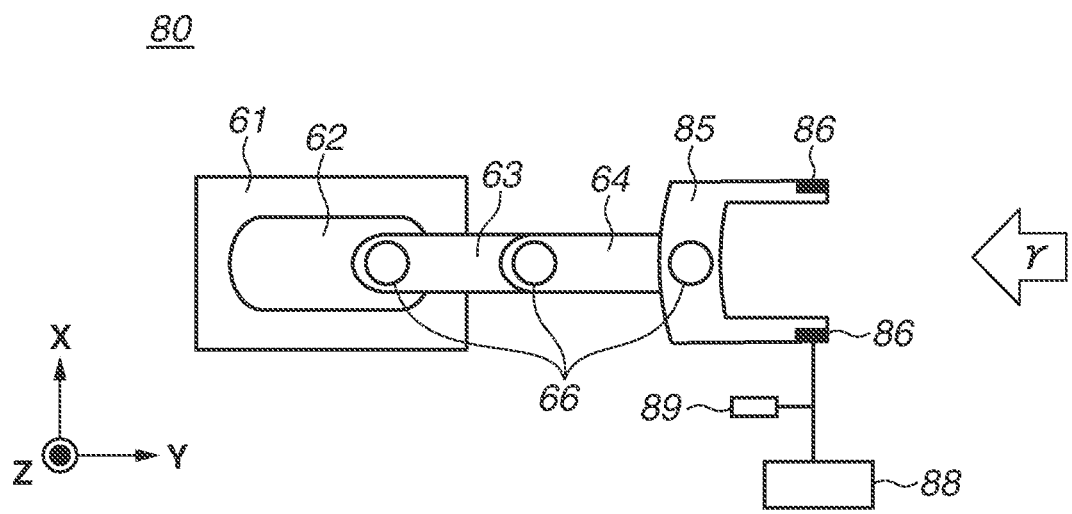
FIGS. 15A and 15B are diagrams illustrating a configuration of a conveyance unit according to a third exemplary embodiment.
Figure 15B:
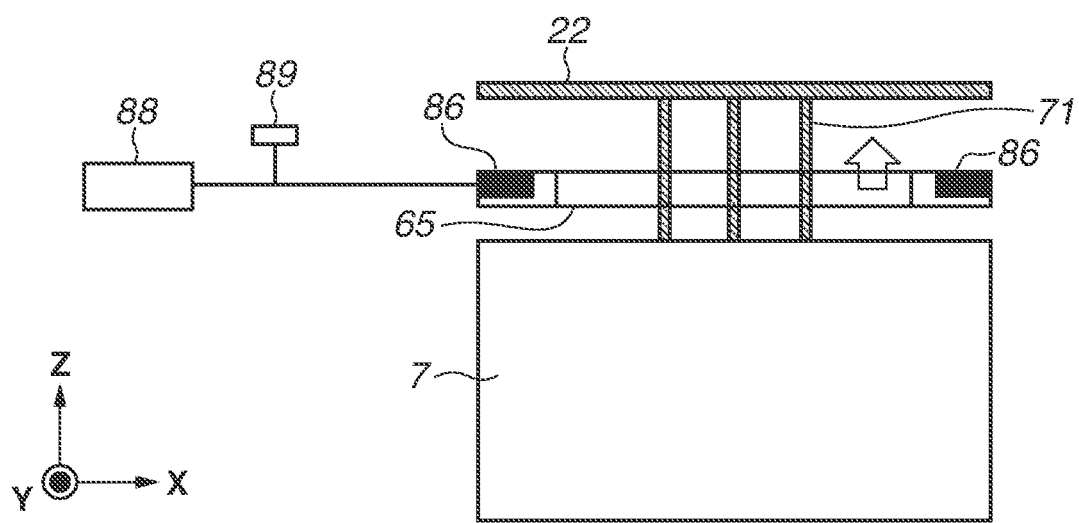

A third exemplary embodiment will be described. A determination unit 8 according to the present exemplary embodiment determines gaps g using a method different from that in the first exemplary embodiment. FIGS. 15A and 15B are diagrams illustrating a configuration of a conveyance unit 80 according to the present exemplary embodiment. The conveyance unit 80 includes a hand 85, and holds and conveys a substrate 22 with the hand 85. Suction ports 86 for sucking and holding the substrate 22 are formed in the top surface of the hand 85. The suction ports 86 are connected to an exhaust unit 88 for exhausting ambient air, such as a vacuum pump. The suction ports 86 do not need to be arranged as illustrated in FIGS. 15A and 15B, as long as the substrate 22 can be sucked. For example, a suction port may be formed in the entire top surface of the hand 85, or a plurality of suction ports may be arranged. The layout is not limited in particular. The exhaust unit 88 and the suction ports 86 are connected via an exhaust passage, which is provided with a sensor (pressure sensor) 89 for measuring pressure. Since the exhaust passage connecting the exhaust unit 88 and the suction ports 86 communicates with the space between the substrate 22 and the hand 85, measuring the pressure of the exhaust passage is substantially the same as measuring the pressure of the space between the substrate 22 and the hand 85. As long as the pressure of the space between the substrate 22 and the hand 85 can be measured, the sensor 89 may be located other than on the exhaust passage connecting the exhaust unit 88 and the suction ports 86. The sensor 89 may be located at a position where the pressure of the space between the substrate 22 and the hand 85 can be directly measured.

FIG. 15B is a view of the conveyance unit 80 acquiring the substrate 22 placed on a stage 7, seen in a γ direction illustrated in FIG. 15A. The substrate 22 is placed on support members 71 protruding from the top surface of the stage 7. The hand 85 is inserted under the substrate 22, and then moved toward the substrate 22. The exhaust unit 88 exhausts the air while the hand 85 moves up. The hand 85 holds the substrate 22 by sucking the substrate 22 thereto, whereby the substrate 22 is handed over from the stage 7 to the conveyance unit 80. The suction of the substrate 22 to the hand 85 can prevent displacement of the substrate 22 during conveyance. With the substrate 22 sucked to the hand 85, the suction ports 86 are closed with the substrate 22 and the internal pressure of the exhaust passage changes from the atmospheric pressure to a negative pressure. The determination unit 8 can detect the suction of the substrate 22 to the hand 85 by detecting a change in the internal pressure of the exhaust channel using the sensor 89. In other words, the determination unit 8 can detect the suction of the substrate 22 to the hand 85 from the measurement value of the sensor 89.

The determination unit 8 according to the present exemplary embodiment regards the amount of relative movement between the hand 85 and the substrate 22 until the suction of the substrate 22 when the hand 85 acquires the substrate 22 as the gap g. More specifically, in the example of FIG. 15B, the amount of movement of the hand 85 in a +Z direction to obtain the substrate 22 until the measurement value of the sensor 89 reaches a predetermined value indicating the suction of the substrate 22 to the sensor 89 is regarded as the gap g. Such determination of the gap g can simplify the apparatus since sensors for measuring the gap g do not need to be provided for the respective units.

A fourth exemplary embodiment will be described. The present exemplary embodiment is characterized in manufacturing an article using the determination methods described in the first to third exemplary embodiments.

FIG. 16 is a flowchart of a method for manufacturing an article according to the present exemplary embodiment. In step S600, a first measurement process for measuring first relative positions that are relative positions between members corresponding to a plurality of respective measurement positions and a conveyance unit when the conveyance unit moves to the plurality of respective measurement positions is performed. In step S610, a second measurement process for measuring second relative positions that are relative positions between the members corresponding to the plurality of respective measurement positions and the conveyance unit when the conveyance unit moves to the plurality of respective measurement positions after the first measurement process is performed. In step S620, a determination process for determining the presence or absence of an abnormality in the conveyance unit and the presence or absence of an abnormality in the floor at one of the measurement positions based on measurement results of the first and second measurement processes is performed. In step S630, a formation process for forming a pattern on a substrate conveyed by the conveyance unit is performed. In step S640, a manufacturing process for manufacturing an article with the substrate on which the pattern is formed by the formation process is performed.

Examples of the article to be manufactured by this manufacturing method include a semiconductor integrated circuit (IC) element, a liquid crystal display element, a color filter, and microelectromechanical systems (MEMS).

The formation process forms the pattern on the substrate, for example, by exposing a substrate (silicon wafer or glass plate) having a photosensitive material applied on a patterning material, using an exposure apparatus (lithographic apparatus).

The manufacturing process includes, for example, development of the patterned substrate (photosensitive material), etching and resist removal of the developed substrate, dicing, bonding, and packaging. According to this manufacturing method, abnormalities in the apparatus can be identified more promptly than heretofore, and the abnormalities can be appropriately dealt with.

The disclosure of this specification includes the following determination method, determination apparatus, information processing method, storage medium, information processing apparatus, lithographic apparatus, and method for manufacturing an article:

[Item 1]
A determination method comprising:
measuring first relative positions as a first measurement, the first relative positions being relative positions between members corresponding to a plurality of respective measurement positions and a conveyance unit when the conveyance unit moves to the plurality of respective measurement positions;
measuring second relative positions as a second measurement, the second relative positions being the relative positions between the members corresponding to the plurality of respective measurement positions and the conveyance unit when the conveyance unit moves to the plurality of respective measurement positions after the first measurement; and
determining presence or absence of an abnormality in the conveyance unit and presence or absence of an abnormality in a floor at one of the measurement positions as a determination based on measurement results of the first and second measurements.

[Item 2]
The determination method according to item 1, wherein the determination is made based on a first tendency indicating a tendency of a change in the first and second relative positions when the conveyance unit moves to a first measurement position among the plurality of measurement positions in the first measurement and the second measurement, the first and second relative positions being relative positions between a first member corresponding to the first measurement position and the conveyance unit, and a second tendency indicating a tendency of a change in the first and second relative positions when the conveyance unit moves to a second measurement position different from the first measurement position among the plurality of measurement positions in the first measurement and the second measurement, the first and second relative positions being relative positions between a second member corresponding to the second measurement position and the conveyance unit.

[Item 3]
The determination method according to item 2,
wherein in a case where the first measurement position is on a same floor as the conveyance unit, the second measurement position is on a floor difference from the conveyance unit, and at least one of the first and second relative positions falls outside a first range, there is determined to be an abnormality,
wherein in a case where there is determined to be the abnormality and a difference between the first and second tendencies is less than a first threshold, there is determined to be not an abnormality of a sunken floor but an abnormality in the conveyance unit,
wherein in a case where there is determined to be the abnormality, the difference between the first and second tendencies is greater than the first threshold, and both the first and second relative positions fall within a second range, there is determined to be an abnormality of a sunken floor, and
wherein in a case where there is determined to be the abnormality, the difference between the first and second tendencies is greater than the first threshold, and at least one of the first and second relative positions falls outside the second range, there are determined to be both an abnormality of a sunken floor and an abnormality in the conveyance unit.

[Item 4]
The determination method according to item 2,
wherein in a case where the first and second measurement positions are on a same floor and at least one of the first and second relative positions falls outside a first range, there is determined to be an abnormality,
wherein in a case where there is determined to be the abnormality and a difference between the first and second tendencies is less than a first threshold, there is determined to be not an abnormality of a floor tilt but an abnormality in the conveyance unit,
wherein in a case where there is determined to be the abnormality, the difference between the first and second tendencies is greater than the first threshold, and both the first and second relative positions fall within a second range, there is determined to be an abnormality of a floor tilt, and
wherein in a case where there is determined to be abnormality, the difference between the first and second tendencies is greater than the first threshold, and at least one of the first and second relative positions falls outside the second range, there are determined to be both an abnormality of a floor tilt and an abnormality in the conveyance unit.

[Item 5]

The determination method according to any one of items 1 to 4, wherein a reference position is adjusted based on a result of the determination, the reference position being a position where at least a part of the conveyance unit is inserted at one or more or all of the plurality of measurement positions.

[Item 6]

The determination method according to any one of items 1 to 5, wherein a/the reference position is adjusted based on the result of the determination even at a position not included in the plurality of measurement positions.

[Item 7]

The determination method according to any one of items 1 to 6, wherein the members corresponding to the plurality of respective measurement positions are substrates.

[Item 8]

The determination method according to any one of items 1 to 7, wherein the plurality of measurement positions includes a position of at least one of a substrate stage for a substrate to be placed on, a temperature adjustment unit configured to adjust a temperature of the substrate, and an alignment unit configured to align the substrate.

[Item 9]

The determination method according to any one of items 1 to 8, wherein the first measurement and the second measurement use a sensor configured to detect a position of the conveyance unit.

[Item 10]

The determination method according to any one of items 1 to 9, wherein the first measurement and the second measurement include determining the relative positions based on amounts of relative movement between the conveyance unit and the members corresponding to the plurality of respective measurement positions until the conveyance unit acquires the members when at least the conveyance unit or the members are moved in a direction where the conveyance unit and the members approach.

[Item 11]

The determination method according to item 10, wherein whether the conveyance unit acquires the members is determined based on a measurement value of a pressure sensor configured to measure a pressure between the conveyance unit and the members.

[Item 12]

The determination method according to any one of items 1 to 11, wherein the relative positions between the members and the conveyance unit are measured each time the conveyance unit moves to the plurality of respective measurement positions.

[Item 13]

A determination apparatus comprising a determination unit configured to determine an abnormality based on relative positions between members corresponding to a plurality of respective measurements and a conveyance unit,
wherein the determination unit is configured to
measure first relative positions that are the relative positions between the members corresponding to the plurality of respective measurement positions and the conveyance unit when the conveyance unit moves to the plurality of respective measurement positions,
measure second relative positions that are the relative positions between the members corresponding to the plurality of respective measurement positions and the conveyance unit when the conveyance unit moves to the plurality of respective measurement positions after the first relative positions are measured, and
determine presence or absence of an abnormality in the conveyance unit and presence or absence of an abnormality in a floor at one of the measurement positions based on the first and second relative positions.

[Item 14]

A lithographic apparatus for forming a pattern on a substrate, the lithographic apparatus comprising:
the determination apparatus according to item 13, the determination apparatus being configured to determine the presence or absence of the abnormality in the conveyance unit and the presence or absence of the abnormality in the floor at one of the measurement positions inside the lithographic apparatus; and
a pattern formation unit configured to form the pattern on the substrate.

[Item 15]

A method for manufacturing an article, the method comprising:
forming a pattern on a substrate conveyed by a conveyance unit;
manufacturing the article with the patterned substrate;
measuring first relative positions as a first measurement, the first relative positions being relative positions between members corresponding to a plurality of respective measurement positions and the conveyance unit when the conveyance unit moves to the plurality of respective measurement positions;
measuring second relative positions as a second measurement, the second relative positions being the relative positions between the members corresponding to the plurality of respective measurement positions and the conveyance unit when the conveyance unit moves to the plurality of respective measurement positions after the first measurement; and
determining presence or absence of an abnormality in the conveyance unit and presence or absence of an abnormality in a floor at one of the measurement positions as a determination based on measurement results of the first and second measurements.

The present disclosure is not limited to the foregoing exemplary embodiments, and various changes and modifications can be made without departing from the sprit and scope of the disclosure. The claims are therefore appended to make the scope of the disclosure public.

According to an exemplary embodiment of the present disclosure, a determination method advantageous in identifying a cause of a change in a relative position between a conveyance unit and a member, such as a substrate, can be provided.

OTHER EMBODIMENTS

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc™ (BD)), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-161856, filed Oct. 6, 2022, which is hereby incorporated by reference herein in its entirety.

What is claimed is:

1. A determination method comprising:
   measuring first relative positions as a first measurement, wherein the first relative positions are relative positions between substrates corresponding to a plurality of respective measurement positions and a conveyor when the conveyor moves to the plurality of respective measurement positions, each substrate of the substrates being disposed at a respective measurement position of the plurality of measurement positions;
   measuring second relative positions as a second measurement, wherein the second relative positions are the relative positions between the substrates corresponding to the plurality of respective measurement positions and the conveyor when the conveyor moves to the plurality of respective measurement positions after the first measurement; and
   determining presence or absence of an abnormality in the conveyor and presence or absence of an abnormality in a floor at one measurement position of the plurality of respective measurement positions as a determination based on measurement results of the first and second measurements.

2. The determination method according to claim 1, wherein the determination is made based on:
   (i) a first tendency indicating a tendency of a change in the first and second relative positions when the conveyor moves to a first measurement position among the plurality of respective measurement positions in the first measurement and the second measurement, where the first and second relative positions are relative positions between a first substrate corresponding to the first measurement position and the conveyor, and
   (ii) a second tendency indicating a tendency of a change in the first and second relative positions when the conveyor moves to a second measurement position different from the first measurement position among the plurality of respective measurement positions in the first measurement and the second measurement, where the first and second relative positions further are relative positions between a second substrate corresponding to the second measurement position and the conveyor.

3. The determination method according to claim 2, wherein the first measurement position is on the same floor as the conveyor, the second measurement position is on a floor different from the conveyor, and at least one of the first and second relative positions falls outside a first range such that an abnormality is determined to be present, and
   wherein:
   (i) an abnormality is determined to be present and a difference between the first and second tendencies is less than a first threshold such that the abnormality determined to be present is not an abnormality of a sunken floor but is an abnormality in the conveyor,
   (ii) an abnormality is determined to be present, the difference between the first and second tendencies is greater than the first threshold, and both the first and second relative positions fall within a second range such that the abnormality determined to be present is an abnormality of the sunken floor, or
   (iii) an abnormality is determined to be present, the difference between the first and second tendencies is greater than the first threshold, and at least one of the first and second relative positions falls outside the second range such that the abnormality determined to be present is both an abnormality of the sunken floor and an abnormality in the conveyor.

4. The determination method according to claim 2, wherein the first and second measurement positions are on the same floor and at least one of the first and second relative positions falls outside a first range such that an abnormality is determined to be present, and
   wherein:
   (i) an abnormality is determined to be present and a difference between the first and second tendencies is less than a first threshold such that the abnormality determined to be present is not an abnormality of a floor tilt but is an abnormality in the conveyor,
   (ii) an abnormality is determined to be present, the difference between the first and second tendencies is greater than the first threshold, and both the first and second relative positions fall within a second range such that the abnormality determined to be present is an abnormality of the floor tilt, or
   (iii) an abnormality is determined to be present, the difference between the first and second tendencies is greater than the first threshold, and at least one of the first and second relative positions falls outside the second range, such that the abnormality determined to be present is both an abnormality of the floor tilt and an abnormality in the conveyor.

5. The determination method according to claim 1, wherein a reference position (i) is a position where at least a part of the conveyor is inserted at one or more or all of the plurality of respective measurement positions and (ii) is adjusted based on a result of the determination.

6. The determination method according to claim 5, wherein the reference position is adjusted based on the result of the determination even at a position not included in the plurality of respective measurement positions.

7. The determination method according to claim 1, wherein the conveyor operates to convey each of the substrates corresponding to the plurality of respective measurement positions to or from a respective measurement position of the plurality of respective measurement positions.

8. The determination method according to claim 1, wherein the plurality of respective measurement positions includes a position of at least one of the following: a substrate stage for a substrate of the substrates to be placed on, a temperature adjustment unit configured to adjust a temperature of the substrate, and an alignment unit configured to align the substrate.

9. The determination method according to claim 1, wherein the first measurement and the second measurement use a sensor configured to detect a position of the conveyor.

10. The determination method according to claim 1, wherein measuring as the first measurement and the second measurement each include determining the respective relative positions based on amounts of relative movement between the conveyor and the substrates corresponding to the plurality of respective measurement positions until it is determined that the conveyor acquires the substrates when at least the conveyor or the substrates are moved in a direction where the conveyor and the substrates approach.

11. The determination method according to claim 10, wherein determining that the conveyor acquires the substrates is based on a measurement value of a pressure sensor configured to measure a pressure between the conveyor and the substrates.

12. The determination method according to claim 1, wherein the relative positions between the substrates and the conveyor are measured each time the conveyor moves to the plurality of respective measurement positions.

13. The determination method according to claim 1, further comprising:
determining differences, δ, of the measurement results of the relative positions at respective measurement positions from respective previous measurement results;
determining differences, Δ, between the differences, δ, of the measurement results;
determining averages, P, of the differences, Δ; and
determining whether the measured first and second relative positions fall within a first range such that no abnormality exists, or
determining whether the first and second relative positions do not fall within the first range such that an abnormality exists, determining whether a first average of the averages, P, is less than a first threshold such that the abnormality is determined to be in the conveyor, determining whether a second average of the averages, P, is less than a second threshold and whether the measured first and second relative positions fall within a second range such that the abnormality is a sunken floor or whether the measured first and second relative positions do not fall within the second range such that the abnormality is the sunken floor and a floor tilt, or determining whether the second average of the averages, P, is greater than or equal to the second threshold and whether the measured first and second relative positions do fall within the second range such that the abnormality is the sunken floor and the floor tilt or whether the second average of the averages, P, is greater than or equal to the second threshold and whether the measured first and second relative positions do not fall within the second range such that the abnormality includes the abnormality in the conveyor and the abnormality of the sunken floor and the floor tilt, and issuing a notification about the determined abnormality or abnormalities.

14. The determination method according to claim 1, wherein one or more of the following:
(i) the conveyor and the substrates corresponding to the plurality of respective measurement positions are located in one chamber or in the same chamber; and/or
(ii) the first and second relative positions are measured using one or more sensors disposed laterally or adjacent to the conveyor and the substrates such that the one or more sensors operate to measure the relative positions between the substrates and the conveyor.

15. A determination apparatus comprising:
one or more processors that operate to determine an abnormality based on relative positions between substrates corresponding to a plurality of respective measurements and a conveyor,
wherein the one or more processors operate to perform operations including:
measuring first relative positions that are the relative positions between the substrates corresponding to the plurality of respective measurement positions and the conveyor when the conveyor moves to the plurality of respective measurement positions, each substrate of the substrates being disposed at a respective measurement position of the plurality of measurement positions,
measuring second relative positions that are the relative positions between the substrates corresponding to the plurality of respective measurement positions and the conveyor when the conveyor moves to the plurality of respective measurement positions after the first relative positions are measured, and
determining presence or absence of an abnormality in the conveyor and presence or absence of an abnormality in a floor at one measurement position of the plurality of respective measurement positions based on the measurement results of the first and second relative positions.

16. A lithographic apparatus for forming a pattern on a substrate, the lithographic apparatus comprising:
a pattern formation unit configured to form the pattern on the substrate; and
the determination apparatus according to claim 15 where the one measurement position is inside the lithographic apparatus and the determination apparatus is configured to determine the presence or absence of an abnormality in the conveyor and the presence or absence of an abnormality in the floor at the one measurement position inside the lithographic apparatus,
wherein the substrate is one of the substrates.

17. An information processing method comprising:
obtaining measurement results of first relative positions that are relative positions between substrates corresponding to a plurality of respective measurement positions and a conveyor when the conveyor moves to the plurality of respective measurement positions, each substrate of the substrates being disposed at a respective measurement position of the plurality of measurement positions;
obtaining measurement results of second relative positions that are the relative positions between the substrates corresponding to the plurality of respective measurement positions and the conveyor when the conveyor moves to the plurality of respective measurement positions after the first relative positions are measured; and
determining presence or absence of an abnormality in the conveyor and presence or absence of an abnormality in a floor at one measurement position of the plurality of respective measurement positions based on the obtained measurement results of the first and second relative positions.

18. A non-transitory computer-readable storage medium storing a program for causing a computer to execute the information processing method according to claim 17.

19. An information processing apparatus comprising:
one or more sensors that operate to obtain relative positions between substrates corresponding to a plurality of respective measurement positions and a conveyor; and
one or more processors that operate to determine an abnormality based on information obtained by the one or more sensors,
wherein the one or more sensors operate to obtain measurement results of first relative positions that are the relative positions between the substrates corresponding to the plurality of respective measurement positions and the conveyor when the conveyor moves to the plurality of respective measurement positions, each substrate of the substrates being disposed at a respective measurement position of the plurality of measurement positions,
wherein the one or more sensors further operate to obtain measurement results of second relative positions that are the relative positions between the substrates corresponding to the plurality of respective measurement positions and the conveyor when the conveyor moves to the plurality of respective measurement positions after the first relative positions are measured, and
wherein the one or more processors operate to determine presence or absence of an abnormality in the conveyor and presence or absence of an abnormality in a floor at one measurement position of the plurality of respective measurement positions based on the measurement results of the first and second relative positions obtained by the one or more sensors.

20. A method for manufacturing an article, the method comprising:
forming a pattern on a substrate conveyed by a conveyor;
manufacturing the article with the patterned substrate;
measuring first relative positions as a first measurement, wherein the first relative positions are relative positions between substrates corresponding to a plurality of respective measurement positions and the conveyor when the conveyor moves to the plurality of respective measurement positions, each substrate of the substrates being disposed at a respective measurement position of the plurality of measurement positions;
measuring second relative positions as a second measurement, wherein the second relative positions are the relative positions between the substrates corresponding to the plurality of respective measurement positions and the conveyor when the conveyor moves to the plurality of respective measurement positions after the first measurement; and
determining presence or absence of an abnormality in the conveyor and presence or absence of an abnormality in a floor at one measurement position of the plurality of respective measurement positions as a determination based on measurement results of the first and second measurements,
wherein the substrate is one of the substrates.

* * * * *